US012598758B2

(12) United States Patent
Hwang et al.

(10) Patent No.: US 12,598,758 B2
(45) Date of Patent: Apr. 7, 2026

(54) SEMICONDUCTOR DEVICE INCLUDING DUMMY PAD

(71) Applicant: Samsung Electronics Co., Ltd., Suwon-si (KR)

(72) Inventors: Inhyo Hwang, Suwon-si (KR); Young Lyong Kim, Suwon-si (KR); Hyunsoo Chung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 336 days.

(21) Appl. No.: 18/181,731

(22) Filed: Mar. 10, 2023

(65) Prior Publication Data

US 2024/0006356 A1     Jan. 4, 2024

(30) Foreign Application Priority Data

Jul. 1, 2022     (KR) ........................ 10-2022-0081375

(51) Int. Cl.
 *H01L 23/00* (2006.01)
 *H01L 21/66* (2006.01)
 (Continued)

(52) U.S. Cl.
 CPC .............. *H01L 24/06* (2013.01); *H01L 21/78* (2013.01); *H01L 22/12* (2013.01); *H01L 22/32* (2013.01);
 (Continued)

(58) Field of Classification Search
 CPC ................... H01L 22/32; H01L 23/585; H01L 2225/06562; H01L 25/0657; H01L 25/18;
 (Continued)

(56) References Cited

U.S. PATENT DOCUMENTS 9,478,520 B2     10/2016  Tsukimura et al.
10,692,826 B2 *   6/2020  Wei ........................ H10F 39/024
(Continued)

FOREIGN PATENT DOCUMENTS

JP          2022-054427 A     4/2022
KR       1020210086675 A     7/2021
KR       10-2021-0122285 A   10/2021

*Primary Examiner* — Mamadou L Diallo
(74) *Attorney, Agent, or Firm* — Wolf, Greenfield & Sacks, P.C.

(57) ABSTRACT

A semiconductor device may include a first substrate including device and edge regions, a first insulating structure on the first substrate, first metal pads and first dummy pads at the uppermost end of the first insulating structure, a second insulating structure on the first insulating structure, second metal pads and second dummy pads at the lowermost end of the second insulating structure, a first interconnection structure in the first insulating structure, electrically connected to the first metal pads and electrically isolated from the first dummy pads, and a second interconnection structure in the second insulating structure, electrically connected to the second metal pads, and electrically isolated from the second dummy pads. Ones of the first metal pads may be in contact with respective ones of the second metal pads on the device region, and ones of the first dummy pads may be in contact with respective ones of the second dummy pads on the edge region.

19 Claims, 27 Drawing Sheets

(51) Int. Cl.
*H01L 21/78* (2006.01)
*H01L 23/58* (2006.01)
*H10B 80/00* (2023.01)

(52) U.S. Cl.
CPC .......... *H01L 23/562* (2013.01); *H01L 23/564* (2013.01); *H01L 23/585* (2013.01); *H01L 24/08* (2013.01); *H10B 80/00* (2023.02); *H01L 2224/06517* (2013.01); *H01L 2224/08145* (2013.01); *H01L 2924/1431* (2013.01); *H01L 2924/14511* (2013.01); *H01L 2924/35121* (2013.01)

(58) Field of Classification Search
CPC ..................... H01L 24/06; H01L 24/08; H01L 2224/06517; H01L 2224/08145; H10B 43/40
See application file for complete search history.

(56) References Cited

U.S. PATENT DOCUMENTS

| | | | |
|---|---|---|---|
| 11,069,735 B2 | 7/2021 | Kotoo et al. | |
| 11,114,433 B2 | 9/2021 | Chen et al. | |
| 2020/0243455 A1 | 7/2020 | Wang et al. | |
| 2021/0327852 A1 | 10/2021 | Teng et al. | |
| 2021/0366855 A1 * | 11/2021 | Okina ..................... | H01L 24/08 |
| 2021/0391376 A1 | 12/2021 | Chen et al. | |
| 2022/0013502 A1 * | 1/2022 | Lee ..................... | H01L 23/5385 |
| 2023/0139919 A1 * | 5/2023 | Hu .......................... | H01L 25/50 |
| | | | 257/774 |

* cited by examiner

SEMICONDUCTOR DEVICE INCLUDING DUMMY PAD

CROSS-REFERENCE TO RELATED APPLICATIONS

This U.S. non-provisional patent application claims priority under 35 U.S.C. § 119 to Korean Patent Application No. 10-2022-0081375, filed on Jul. 1, 2022, in the Korean Intellectual Property Office, the entire contents of which are hereby incorporated by reference.

BACKGROUND OF THE INVENTION

The present disclosure relates to a semiconductor device, and in particular, a semiconductor device including a dummy pad.

In general, a wafer, which is used to fabricate semiconductor devices, may include a chip region, in which a plurality of cells is formed, and a scribe lane, which is used for division of chips. A plurality of electronic components (e.g., transistors, resistors, and capacitors) may be formed on the chip region but not on the scribe lane, and the wafer may be cut along the scribe lane to form individual chips. Test patterns or alignment keys may be formed on the scribe lane. Here, the test patterns may be used to monitor electric characteristics of a semiconductor device formed in the chip region or to examine whether there is a failure pattern in the chip region. The alignment key may be used in an exposure process.

SUMMARY

Some embodiments of the inventive concept provide a semiconductor device with improved reliability.

According to some embodiments of the inventive concept, a semiconductor device may include a first substrate including a device region and an edge region, a first insulating structure on the first substrate, first metal pads and first dummy pads at the uppermost end of the first insulating structure, a second insulating structure on the first insulating structure, second metal pads and second dummy pads at the lowermost end of the second insulating structure, a first interconnection structure, which is in the first insulating structure, is electrically connected to the first metal pads, and is electrically isolated from the first dummy pads, and a second interconnection structure, which is in the second insulating structure, is electrically connected to the second metal pads, and is electrically isolated from the second dummy pads. Ones of the first metal pads may be in contact with respective ones of the second metal pads on the device region, and ones of the first dummy pads may be in contact with respective ones of the second dummy pads on the edge region.

According to some embodiments of the inventive concept, a semiconductor device may include a first substrate including a device region and an edge region, a first insulating structure on the first substrate, first metal pads at the uppermost end of the first insulating structure, a second insulating structure on the first insulating structure, second metal pads at the lowermost end of the second insulating structure, a first interconnection structure in the first insulating structure and electrically connected to the first metal pads, a second interconnection structure in the second insulating structure and electrically connected to the second metal pads, and a second guard ring structure extending into the second insulating structure, on the edge region. Ones of the first metal pads may be in contact with respective ones of the second metal pads on the device region, and a distance from an outer side surface of the second insulating structure to the second guard ring structure ranges from 0 to 15 μm.

According to some embodiments of the inventive concept, a semiconductor device may include a first substrate including a device region and an edge region, a first insulating structure on the first substrate, first metal pads and first dummy pads at the uppermost end of the first insulating structure, a second insulating structure on the first insulating structure, second metal pads and second dummy pads at the lowermost end of the second insulating structure, a first interconnection structure, which is in the first insulating structure, is electrically connected to the first metal pads, and is electrically isolated from the first dummy pads, a second interconnection structure, which is in the second insulating structure, is electrically connected to the second metal pads, and is electrically isolated from the second dummy pads, a second guard ring structure on the edge region to extend into the second insulating structure, and a scattering beam blocking pattern on the edge region and in the first insulating structure and overlapping at least one of the first dummy pads. Ones of the first metal pads on the device region may be in contact with respective ones of the second metal pads, and ones of the first dummy pads may be on the edge region and in contact with respective ones of the second dummy pads.

BRIEF DESCRIPTION OF THE DRAWINGS

FIGS. 4A to 4D are sectional views sequentially illustrating a process of fabricating a semiconductor device having the section of FIG. 2A.

FIGS. 10 and 11 are sectional views along the line A-A' of FIG. 7A or 7B.

DETAILED DESCRIPTION

Example embodiments of the inventive concepts will now be described more fully with reference to the accompanying drawings, in which example embodiments are shown.

Figure 1:
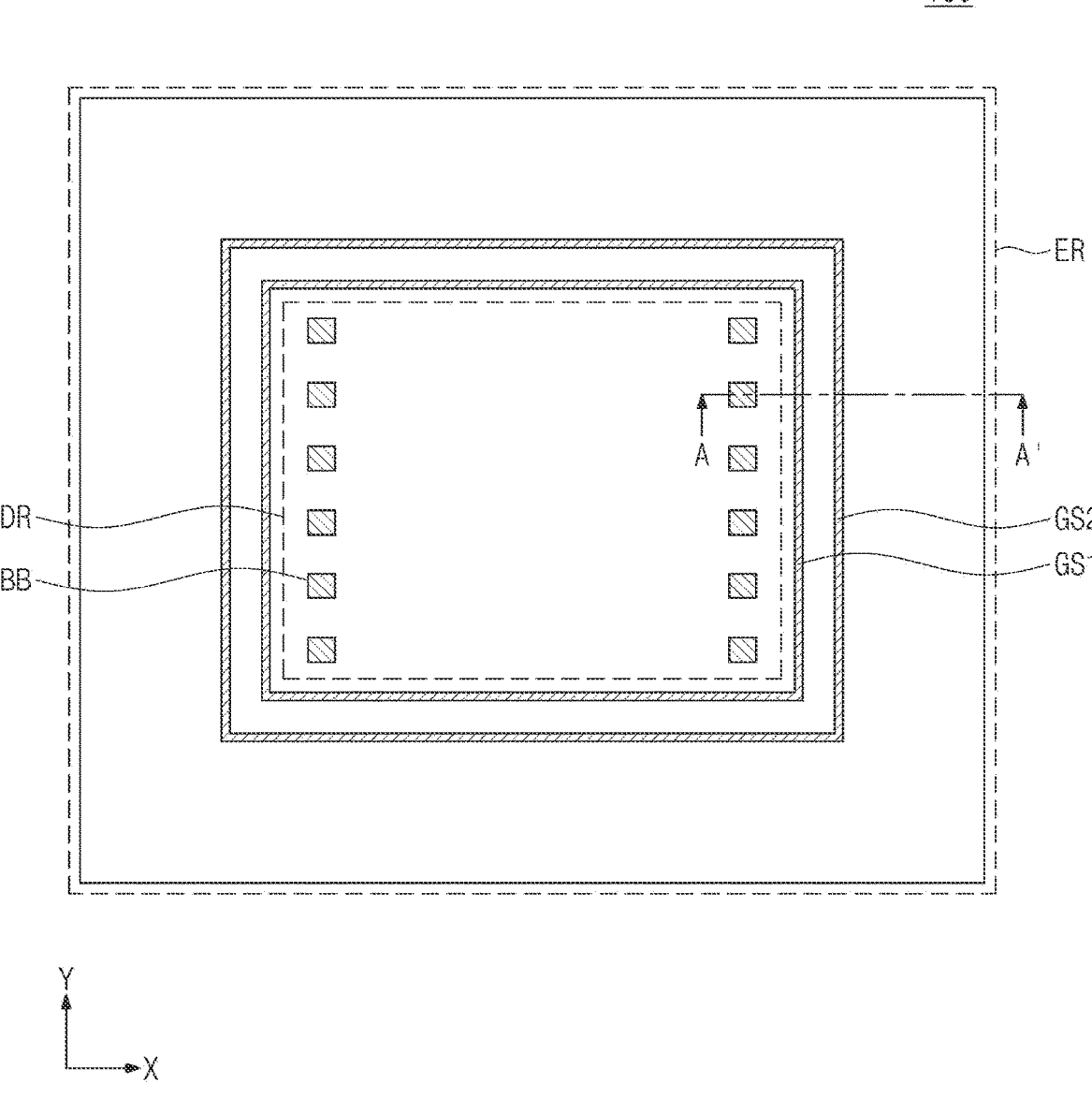
FIG. 1 is a plan view illustrating a semiconductor device according to some embodiments of the inventive concept.
Figure 2A:
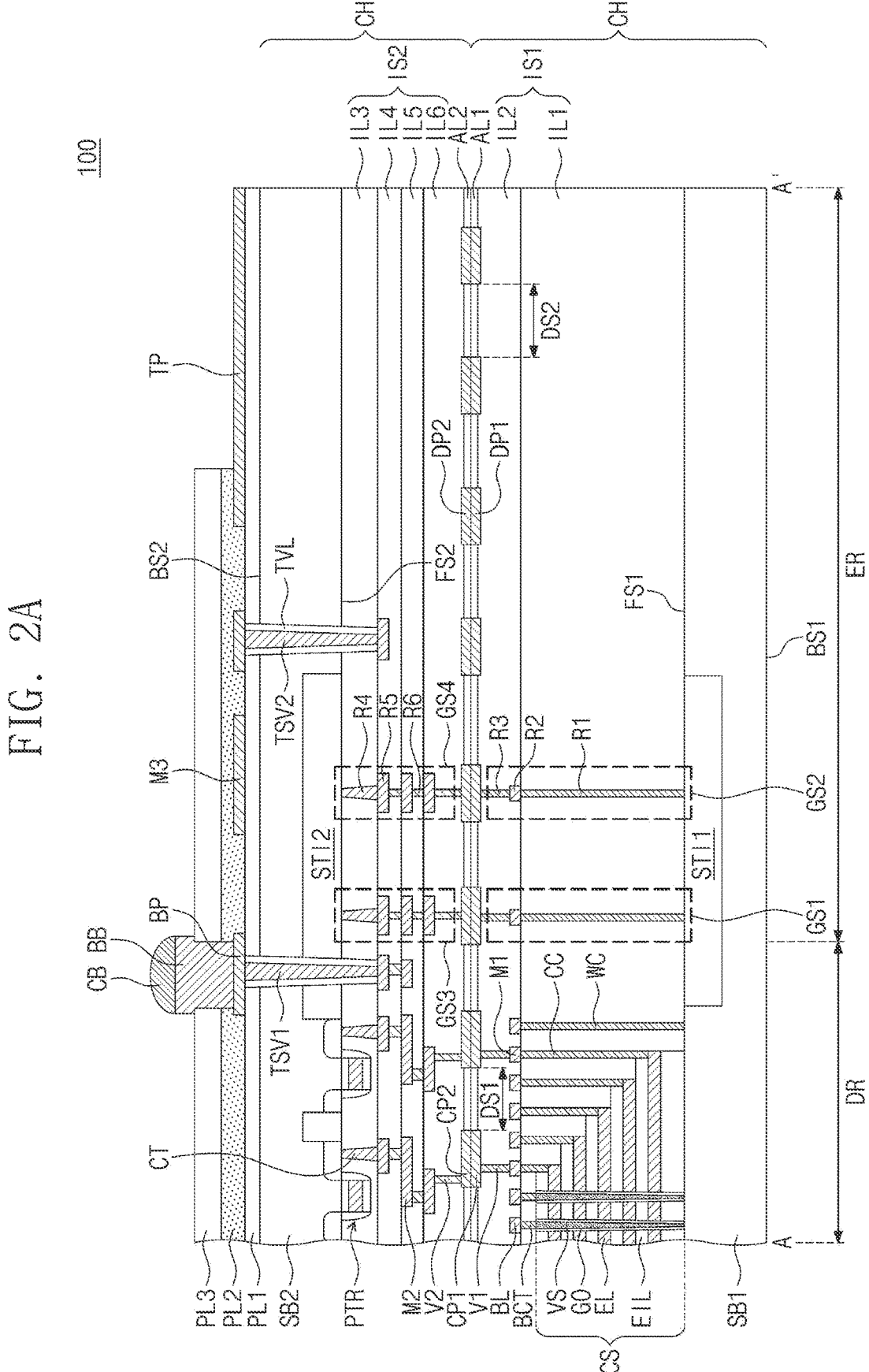
FIG. 2A is a sectional view along a line A-A' of FIG. 1.
Figure 2B:
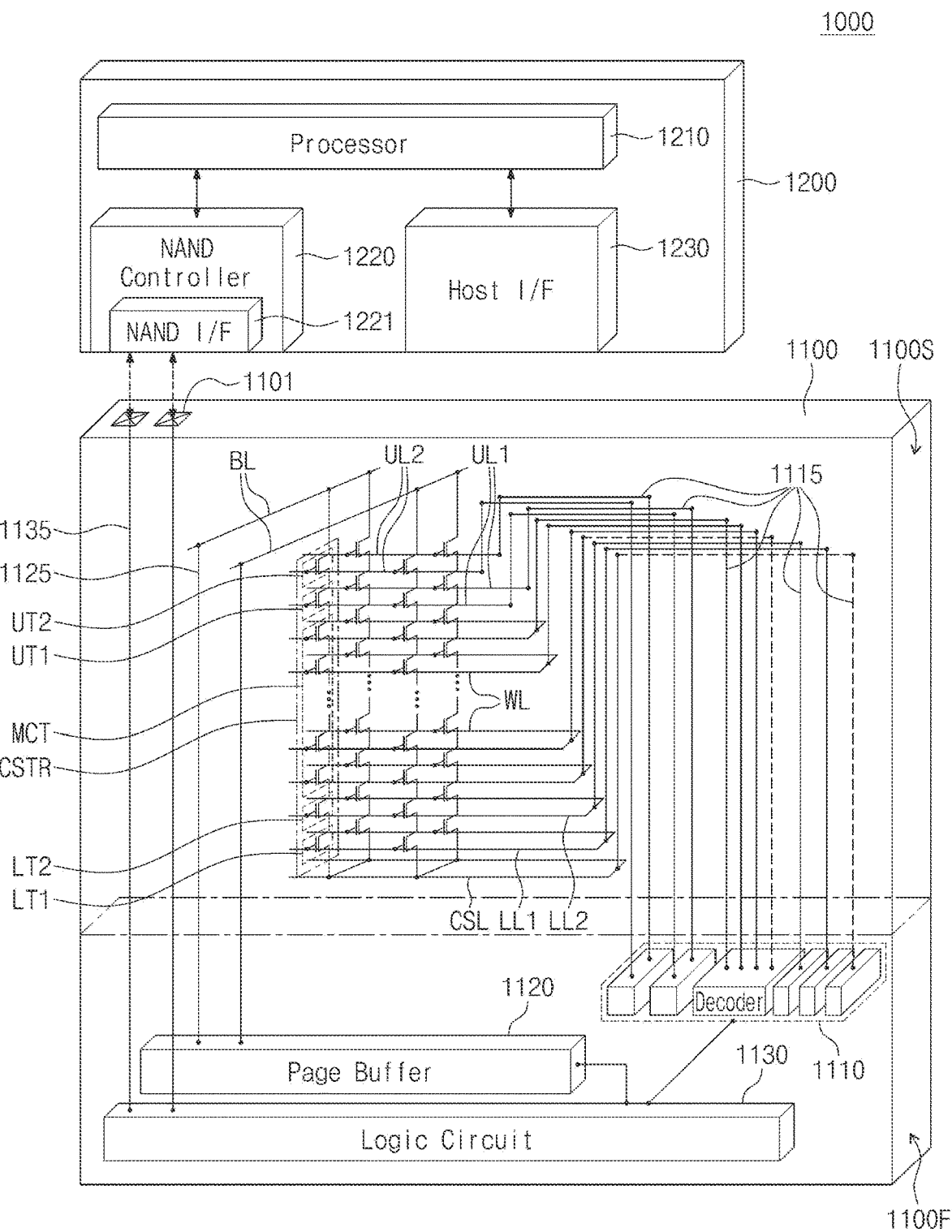
FIG. 2B is a schematic diagram illustrating an electronic system including a semiconductor structure according to some embodiments of the inventive concept.

FIG. 1 is a plan view illustrating a semiconductor device according to some embodiments of the inventive concept. FIG. 2A is a sectional view along a line A-A' of FIG. 1. FIG. 2B is a schematic diagram illustrating an electronic system including a semiconductor structure according to some embodiments of the inventive concept.

Referring to FIGS. 1 and 2A, a semiconductor device 100 according to the present embodiment may include a first sub-chip CH1 and a second sub-chip CH2, which are bonded to each other. The first sub-chip CH1 may include a first substrate SB1 and a first insulating structure IS1 on a first surface FS1 of the first substrate SB1. In some embodiments, the first substrate SB1 may be formed of or include a semiconductor material. For example, the first substrate SB1 may be a single-crystalline silicon wafer. The first substrate SB1 may include a device region DR and an edge region ER enclosing the same. The first substrate SB1 may include a second surface BS1, which is opposite to the first surface FS1. A first device isolation layer STI1 may be in the first substrate SB1. The device region DR may be referred to as a 'chip region'. The edge region ER may be referred to as a 'scribe lane region'.

A memory cell stack CS may be on the first surface FS1 and on the device region DR of the first substrate SB1. The memory cell stack CS may include electrode layers EL and inter-electrode insulating layers EIL, which are alternately stacked on top of each other. Vertical semiconductor patterns VS may extend into the memory cell stack CS and to be adjacent to the first substrate SB1. A gate insulating layer GO may be between the vertical semiconductor patterns VS and the memory cell stack CS. The gate insulating layer GO may include a tunnel insulating layer, a charge storing layer, and a blocking insulating layer sequentially stacked. The electrode layers EL and the inter-electrode insulating layers EIL may include end portions which form a stepwise shape.

The first insulating structure IS1 may include a first interlayer insulating layer IL1 and a second interlayer insulating layer IL2 sequentially stacked. The first and second interlayer insulating layers IL1 and IL2 may be formed of or include at least one of silicon oxide, silicon nitride, silicon oxynitride, or porous insulating materials and may have a single- or multi-layered structure. An etch stop layer may be further between the first and second interlayer insulating layers IL1 and IL2. The first interlayer insulating layer IL1 may be on or cover the memory cell stack CS. Bit line contacts BCT may extend into the first interlayer insulating layer IL1 and to be in contact with the vertical semiconductor patterns VS. Cell contacts CC may extend into the first interlayer insulating layer IL1 and the inter-electrode insulating layers EIL and to be in contact with the end portions of the electrode layers EL, respectively. A well contact WC may extend into the first interlayer insulating layer IL1 and to be in contact with the first substrate SB1.

In the device region DR, bit lines BL and first interconnection lines M1 may be on the first interlayer insulating layer IL1. The bit lines BL may be connected to the bit line contacts BCT. The first interconnection lines M1 may be connected to the cell contacts CC and the well contact WC. The second interlayer insulating layer IL2 may be on or cover the bit lines BL and the first interconnection lines M1. The second interlayer insulating layer IL2 may be covered with a first adhesive layer AL1, e.g., the first adhesive layer AL1 may be on the second interlayer insulating layer IL2. The first adhesive layer AL1 may be formed of or include silicon oxide or silicon nitride. First metal pads CP1 may be in the first adhesive layer AL1. The first metal pads CP1 may be formed of or include copper. The first metal pads CP1 may extend into the first adhesive layer AL1. First vias V1 may be in the second interlayer insulating layer IL2. The first vias V1 may connect the bit lines BL and the first interconnection lines M1 to the first metal pads CP1.

In the edge region ER, a first guard ring structure GS1 and a second guard ring structure GS2 may be in the first insulating structure IS1. Each of the first and second guard ring structures GS1 and GS2 may include a first guard ring R1, a second guard ring R2, and a third guard ring R3 sequentially stacked. The first guard ring R1 may have the same height as the well contact WC and may extend into the first interlayer insulating layer IL1 and may be around a perimeter or outer boundary of the device region DR, for example, to enclose the device region DR in a plan view. The second guard ring R2 may be located at the same height as the first interconnection lines M1 and may have the same thickness as the first interconnection lines M1. The second guard ring R2 may have the same height as the first vias V1 and may extend into the second interlayer insulating layer IL2. Each of the second and third guard rings R2 and R3 may be around a perimeter or outer boundary of the device region DR, for example, to enclose the device region DR, when viewed in a plan view.

The first and second guard ring structures GS1 and GS2 may be used to protect the memory cell stack CS on the device region DR from moisture or a physical crack. At least one of the first and second guard ring structures GS1 and GS2 may be used as a chipping dam.

In the edge region ER, first dummy pads DP1 may be in the first adhesive layer AL1. The first dummy pads DP1 may extend into the first adhesive layer AL1. The first vias V1 may be in the second interlayer insulating layer IL2. Some of the first dummy pads DP1 may be connected to the first and second guard ring structures GS1 and GS2. The first dummy pads DP1 may not be connected to (e.g., be electrically isolated from) the first interconnection lines M1.

The second sub-chip CH2 may include a second substrate SB2 and a second insulating structure IS2, which is on (e.g., to cover) a third surface FS2 of the second substrate SB2. In some embodiments, the second substrate SB2 may be formed of or include a semiconductor material. For example, the second substrate SB2 may be a single-crystalline silicon wafer. The second substrate SB2 may include the device region DR and the edge region ER enclosing the device region DR. The second substrate SB2 may include a fourth surface BS2, which is opposite to the third surface FS2. A second device isolation layer STI2 may be in the second substrate SB2.

In the device region DR of the second substrate SB2, peripheral transistors PTR may be on the third surface FS2. The second insulating structure IS2 may include third to sixth interlayer insulating layers IL3 to IL6 sequentially stacked. The third to sixth interlayer insulating layers IL3 to IL6 may be formed of or include at least one of silicon oxide, silicon nitride, silicon oxynitride, or porous insulating materials and may have a single- or multi-layered structure. An etch stop layer may be further between the third to sixth interlayer insulating layers IL3 to IL6. Peripheral contacts CT may be in the third interlayer insulating layer IL3. Second interconnection lines M2 may be between the third to sixth interlayer insulating layers IL3 to IL6. Second vias V2 may be in the fourth to sixth interlayer insulating layers IL4-IL6.

A second adhesive layer AL2 may be on (e.g., cover) the sixth interlayer insulating layer IL6. The second adhesive layer AL2 may be formed of or include silicon oxide or silicon nitride. Second metal pads CP2 may be in the second adhesive layer AL2. The second metal pads CP2 may be formed of or include copper. The second metal pads CP2 may extend into the second adhesive layer AL2. The second vias V2 may connect the second interconnection lines M2 to the second metal pads CP2.

In the edge region ER, a third guard ring structure GS3 Sand a fourth guard ring structure GS4 may be in the second insulating structure IS2. Each of the third and fourth guard ring structures GS3 and GS4 may include fourth to sixth guard rings R4 to R6 sequentially stacked. The fourth guard ring R4 may have the same height as the peripheral contacts CT and may extend into the third interlayer insulating layer IL3 and may be around a perimeter or outer boundary of the device region DR, for example, to enclose the device region DR in a plan view. Fifth guard rings R5 may be located at the same height as the second interconnection lines M2 and may have the same thickness as the second interconnection lines M2. The sixth guard rings R6 may have the same height as the second vias V2. Each of the fifth and sixth guard rings R5 and R6 may be around a perimeter or outer boundary of the device region DR, for example, to enclose the device region DR, when viewed in a plan view.

The third and fourth guard ring structures GS3 and GS4 may be used to protect the peripheral transistors PTR, the second interconnection lines M2, and the second vias V2 on the device region DR from moisture or physical crack. At least one of the third and fourth guard ring structures GS3 and GS4 may be used as a chipping dam.

In the edge region ER, second dummy pads DP2 may be in the second adhesive layer AL2. The second dummy pads DP2 may extend into the second adhesive layer AL2. Some of the second dummy pads DP2 may be connected to the third and fourth guard ring structures GS3 and GS4. The second dummy pads DP2 may not be connected to (e.g., be electrically isolated from) the second interconnection lines M2.

The second adhesive layer AL2 may be in contact with the first adhesive layer AL1. Ones of the first metal pads CP1 may be in contact with respective ones of the second metal pads CP2. The first dummy pads DP1 may be in contact with the second dummy pads DP2. There may be no interface between the first metal pads CP1 and the second metal pads CP2 and between the first and second dummy pads DP1 and DP2. The first sub-chip CH1 may be electrically connected to the second sub-chip CH2 through the first metal pads CP1 and the second metal pads CP2.

In some embodiments, the first and second metal pads CP1 and CP2 may be on the edge region ER. In addition, the first and second dummy pads DP1 and DP2 may be on the device region DR.

First to third protection layers PL1 to PL3 may be sequentially stacked on the fourth surface BS2 of the second substrate SB2. The first protection layer PL1 may be formed of or include silicon oxide. The second protection layer PL2 may be formed of or include silicon nitride. The third protection layer PL3 may be formed of or include at least one of photo-sensitive polyimides.

First and second penetration vias TSV1 and TS V2 may extend into the second substrate SB2. A via insulating layer TVL may be between the second substrate SB2 and the first and second penetration vias TSV1 and TSV2. The first and second penetration vias TSV1 and TSV2 may be formed of or include at least one of metallic materials (e.g., tungsten, copper, or aluminum). The via insulating layer TVL may be formed of or include silicon oxide. The first and second penetration vias TSV1 and TSV2 may further extend into the first protection layer PL1 and the third interlayer insulating layer IL3. Bonding pads BP, third interconnection lines M3, and a test pattern TP may be on the first protection layer PL1. The bonding pads BP, the third interconnection lines M3, and the test pattern TP may be formed of or include at least one of metallic materials (e.g., copper, gold, nickel, and aluminum). Conductive bumps BB and a solder layer CB may be sequentially stacked on the bonding pads BP. The conductive bumps BB may be formed of or include copper. The solder layer CB may be formed of or include at least one of tin, lead, or silver. The test pattern TP may be referred to as a 'residual test pattern' or an 'alignment key'.

The second and third protection layers PL2 and PL3 may be on the third interconnection lines M3 (e.g., to cover the third interconnection lines M3). The second and third protection layers PL2 and PL3 may be partially expose the bonding pads BP and the test pattern TP, i.e., the second and third protection layers PL2 and PL3 are not on at least a portion of a top surface of the bonding pads BP. The first penetration vias TSV1 may connect the bonding pads BP to the second interconnection lines M2. The second penetration vias TSV2 may connect the third interconnection lines M3 to the second interconnection lines M2.

In the present embodiment, on an outer sidewall of the semiconductor device 100, the test pattern TP, the first protection layer PL1, the second substrate SB2, the second insulating structure IS2, the second adhesive layer AL2, the first adhesive layer AL1, the first insulating structure IS1 and the first substrate SB1 may have sidewalls that are aligned to each other.

The first and/or second metal pads CP1 and/or CP2 may be spaced apart from each other in a first distance DS1. The first and/or second dummy pads DP1 and/or DP2 may be spaced apart from each other in a second distance DS2. The second distance DS2 may be equal to or larger than the first distance DS1. In some embodiments, the second distance DS2 may be smaller than the first distance DS1. The number of the first and/or second metal pads CP1 and/or CP2 per unit area (i.e., a first disposition density of the first and/or second metal pads CP1 and/or CP2) in the device region DR may be equal to or greater than the number of the first and/or second dummy pads DP1 and/or DP2 per unit area (i.e., a second disposition density of the first and/or second dummy pads DP1 and/or DP2) in the edge region ER. In some embodiments, the first disposition density may be smaller than the second disposition density.

The semiconductor device 100 according to the present embodiment may include the first and second dummy pads DP1 and DP2, which are on the edge region ER. In this case, it may be possible to prevent an un-bonding issue from occurring in a process of bonding the first and second sub-chips CH1 and CH2 to each other. Accordingly, it may be possible to prevent a failure from occurring in an electric connection structure between the first and second sub-chips CH1 and CH2 and thereby to increase a yield, and thus, the semiconductor device 100 may have improved reliability.

In addition, the first and second dummy pads DP1 and DP2 may be used as a diffusion path of hydrogen ions (H±). In this case, it may be possible to improve electrical and operation characteristics of the memory cell stack CS.

Referring to FIG. 2B, an electronic system 1000 according to some embodiments of the inventive concept may include a semiconductor device 1100 and a controller 1200 electrically connected to the semiconductor device 1100. The electronic system 1000 may be a storage device, which includes one or more semiconductor devices 1100, or an electronic device including the storage device. For example, the electronic system 1000 may be a solid state drive (SSD) device, a universal serial bus (USB), a computing system, a medical system, or a communication system, in which at least one semiconductor device 1100 is provided.

The semiconductor device 1100 may be a nonvolatile memory device (e.g., a NAND FLASH memory device). The semiconductor device 1100 may include a first structure 1100F and a second structure 1100S on the first structure 1100F. The second structure 1100S may correspond to the first sub-chip CH1 of FIG. 2A. The first structure 1100F may correspond to the second sub-chip CH2 of FIG. 2A. The semiconductor device 1100 may correspond to the semiconductor device 100 of FIG. 2A.

The first structure 1100F may be a peripheral circuit structure, which includes a decoder circuit 1110, a page buffer 1120, and a logic circuit 1130. The peripheral transistors PTR and the second interconnection lines M2 of FIG. 2A may constitute the decoder circuit 1110, the page buffer 1120, and the logic circuit 1130.

The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL. The electrode layers EL of the memory cell stack CS of FIG. 2A may constitute the common source line CSL, the word lines WL, the first and second gate upper lines UL1 and UL2, and the first and second gate lower lines LL1 and LL2.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be variously changed, according to embodiments.

In some embodiments, the upper transistors UT1 and UT2 may include at least one string selection transistor, and the lower transistors LT1 and LT2 may include at least one ground selection transistor. The gate lower lines LL1 and LL2 may be respectively used as gate electrodes of the lower transistors LT1 and LT2. The word lines WL may be used as gate electrodes of the memory cell transistors MCT, and the gate upper lines UL1 and UL2 may be used as gate electrodes of the upper transistors UT1 and UT2, respectively.

In some embodiments, the lower transistors LT1 and LT2 may include a lower erase control transistor LT1 and a ground selection transistor LT2, which are connected in series. The upper transistors UT1 and UT2 may include a string selection transistor UT1 and an upper erase control transistor UT2, which are connected in series. At least one of the lower and upper erase control transistors LT1 and UT2 may be used for an erase operation of erasing data, which are stored in the memory cell transistors MCT, using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection lines 1115, which are extended from the first structure 1100F into the second structure 1100S. The bit lines BL may be electrically connected to the page buffer 1120 through second connection lines 1125, which are extended from the first structure 1100F to the second structure 1100S.

In the first structure 1100F, the decoder circuit 1110 and the page buffer 1120 may be configured to perform a control operation on at least one transistor that is selected from the memory cell transistors MCT. The decoder circuit 1110 and the page buffer 1120 may be controlled by the logic circuit 1130. The semiconductor device 1100 may communicate with the controller 1200 through an input/output pad 1101, which is electrically connected to the logic circuit 1130. The input/output pad 1101 may be electrically connected to the logic circuit 1130 through an input/output connection line 1135, which is in the first structure 1100F and is extended into the second structure 1100S.

The controller 1200 may include a processor 1210, a NAND controller 1220, and a host interface 1230. In some embodiments, the electronic system 1000 may include a plurality of semiconductor devices 1100, and in this case, the controller 1200 may control the plurality of semiconductor devices 1100.

The processor 1210 may control overall operations of the electronic system 1000 including the controller 1200. The processor 1210 may be operated based on a specific firmware and may control the NAND controller 1220 to access the semiconductor device 1100. The NAND controller 1220 may include a NAND interface 1221 which is used for communication with the semiconductor device 1100. The NAND interface 1221 may be used to transmit and receive control commands to control the semiconductor device 1100, data to be written in or read from the memory cell transistors MCT of the semiconductor device 1100, and so forth. The host interface 1230 may be configured to allow for communication between the electronic system 1000 and an external host. When a control command is received from the external host through the host interface 1230, the processor 1210 may control the semiconductor device 1100 in response to the control command.

Figure 3:
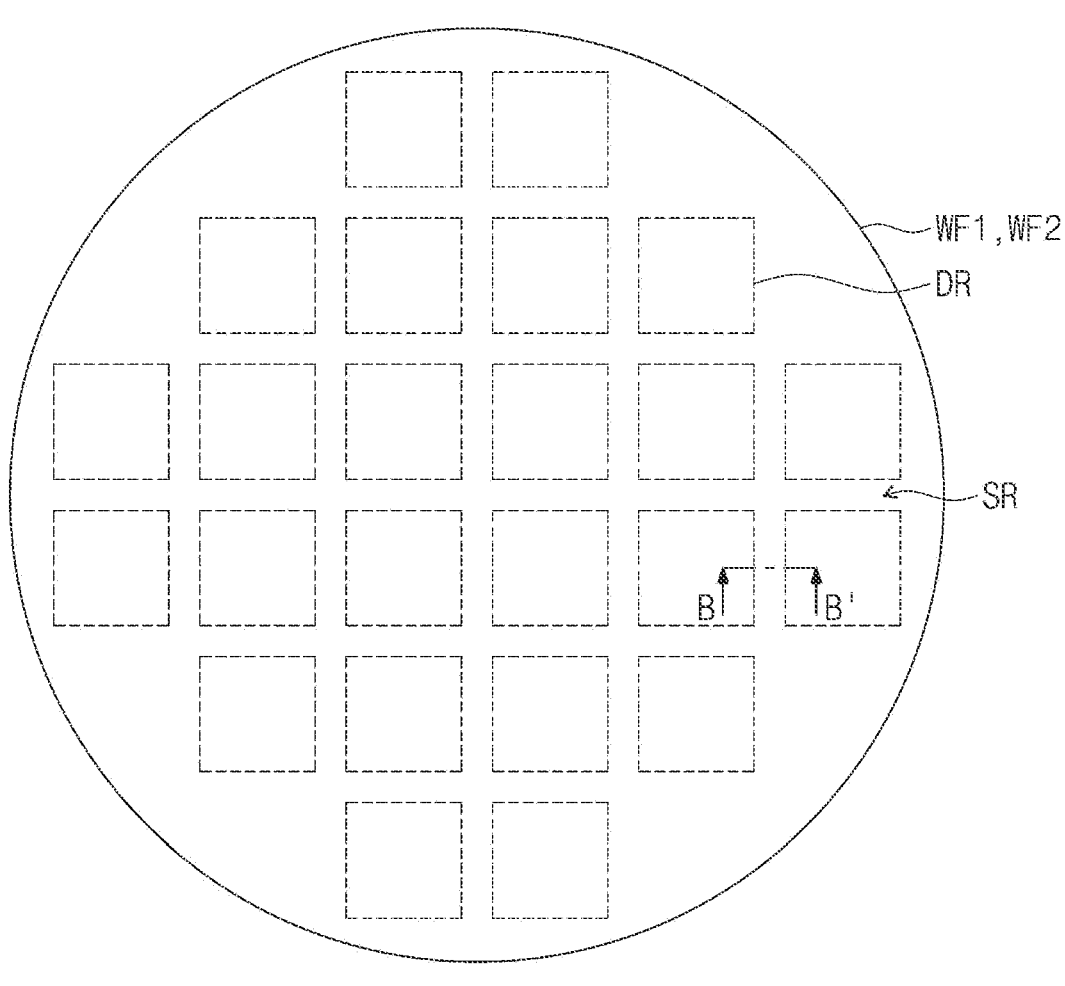
FIG. 3 is a plan view of a wafer.

FIG. 3 is a plan view of a wafer. FIGS. 4A to 4D are sectional views sequentially illustrating a process of fabricating a semiconductor device having the section of FIG. 2A. FIGS. 4A to 4D are sectional views along a line B-B' of FIG. 3.

Figure 4A:
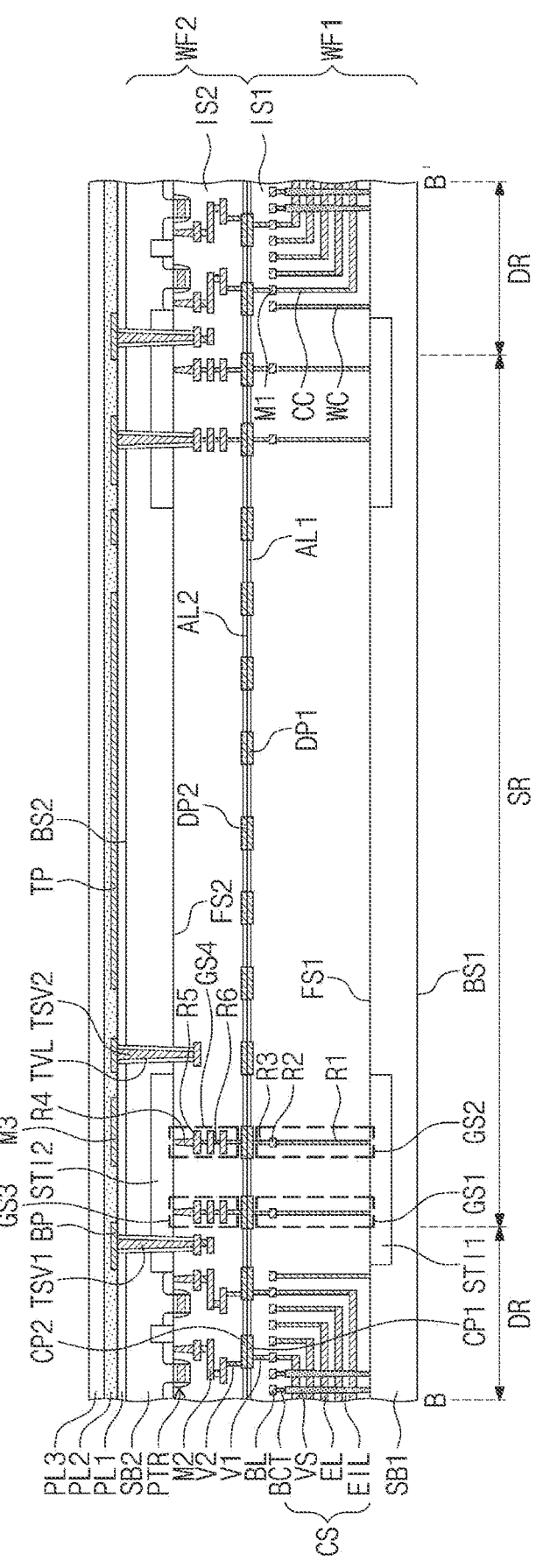

Referring to FIGS. 3 and 4A, a first wafer WF1 and a second wafer WF2 may be prepared, respectively. The first and second wafers WF1 and WF2 may include device regions DR, which overlap each other. A scribe lane region SR may be between the device regions DR. The first wafer WF1 may include the elements of the first sub-chip CH1 described with reference to FIG. 2A. The second wafer WF2 may include the elements of the second sub-chip CH2 described with reference to FIG. 2A. The first wafer WF1 may include the first metal pads CP1 and the first dummy pads DP1, which are at the uppermost end thereof. The second wafer WF2 may include the second metal pads CP2 and the second dummy pads DP2, which are at the uppermost end thereof. The second wafer WF2 may be inverted and may be placed on the first wafer WF1. In this step, the first metal pads CP1 may be in contact with the second metal pads CP2, and the first dummy pads DP1 may be in contact with the second dummy pads DP2. The first and second wafers WF1 and WF2 may be bonded to each other by applying heat and pressure to the first and second wafers WF1 and WF2. Since the first and second dummy pads DP1 and DP2 are in the scribe lane region SR, it may be possible to prevent an un-bonding issue between the first and second wafers WF1 and WF2 from occurring in the bonding process. Accordingly, it may be possible to reduce a failure in an electric connection structure between the wafers WF1 and WF2 and thereby to fabricate the semiconductor device 100 with improved reliability.

After the bonding step of the first and second wafers WF1 and WF2, a grinding process may be performed on the fourth surface BS2 of the second substrate SB2 of the second wafer WF2 to form the second substrate SB2 of a desired thickness. Next, the first protection layer PL1 may be formed on the fourth surface BS2 of the second substrate SB2. Thereafter, the first and second penetration vias TSV1 and TSV2 and the via insulating layer TVL may be formed. The bonding pad BP, the third interconnection lines M3, and the test pattern TP may be formed on the first protection layer PL1. Although not shown, some of the second interconnection lines M2 may be electrically connected to the test pattern TP to form additional test patterns. The second and third protection layers PL2 and PL3 be formed on (e.g., to cover) the bonding pad BP, the third interconnection lines M3, and the test pattern TP.

Figure 4B:
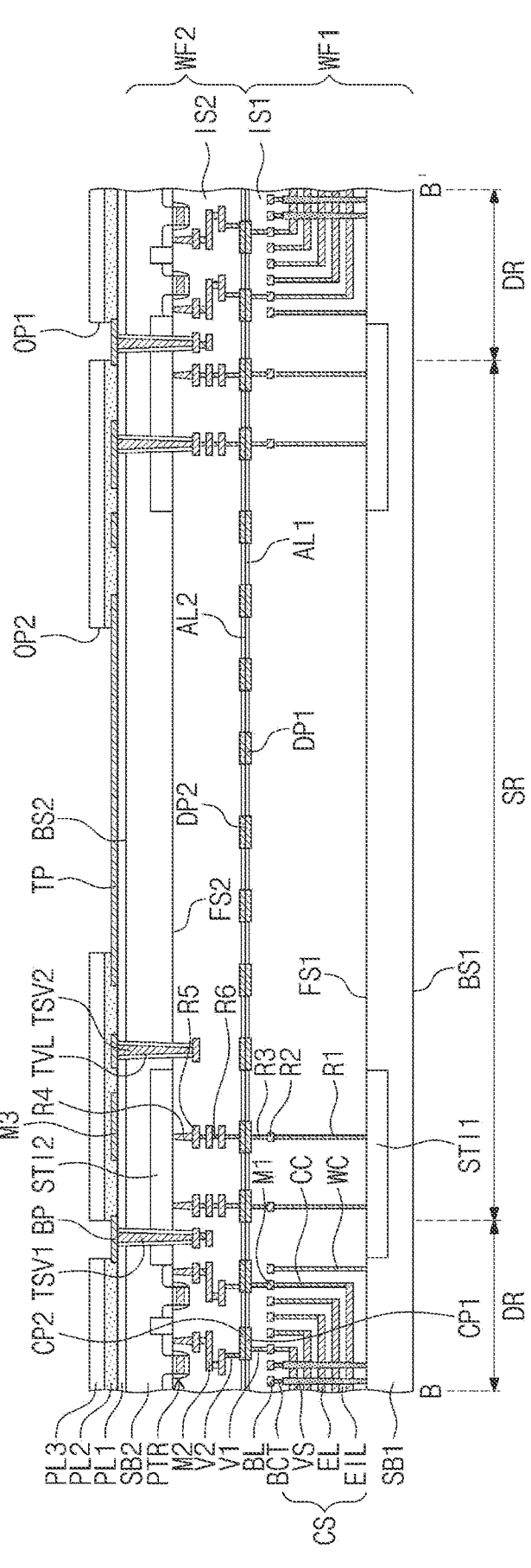

Referring to FIG. 4B, the third and second protection layers PL3 and PL2 may be patterned to form a first opening OP1 exposing the bonding pad BP (i.e., so that the third and second protection layers PL3 and PL2 are not on at least portion of the bonding pad BP) and a second opening OP2 exposing the test pattern TP (i.e., so that the third and second protection layers PL3 and PL2 are not on at least portion of the test pattern). A test process may be performed through the second opening OP2. For example, by bringing a probe needle of a probe card in contact with the test pattern TP and applying test signals to the probe needle, it may be possible to measure an electric current flowing through the test pattern.

Figure 4C:
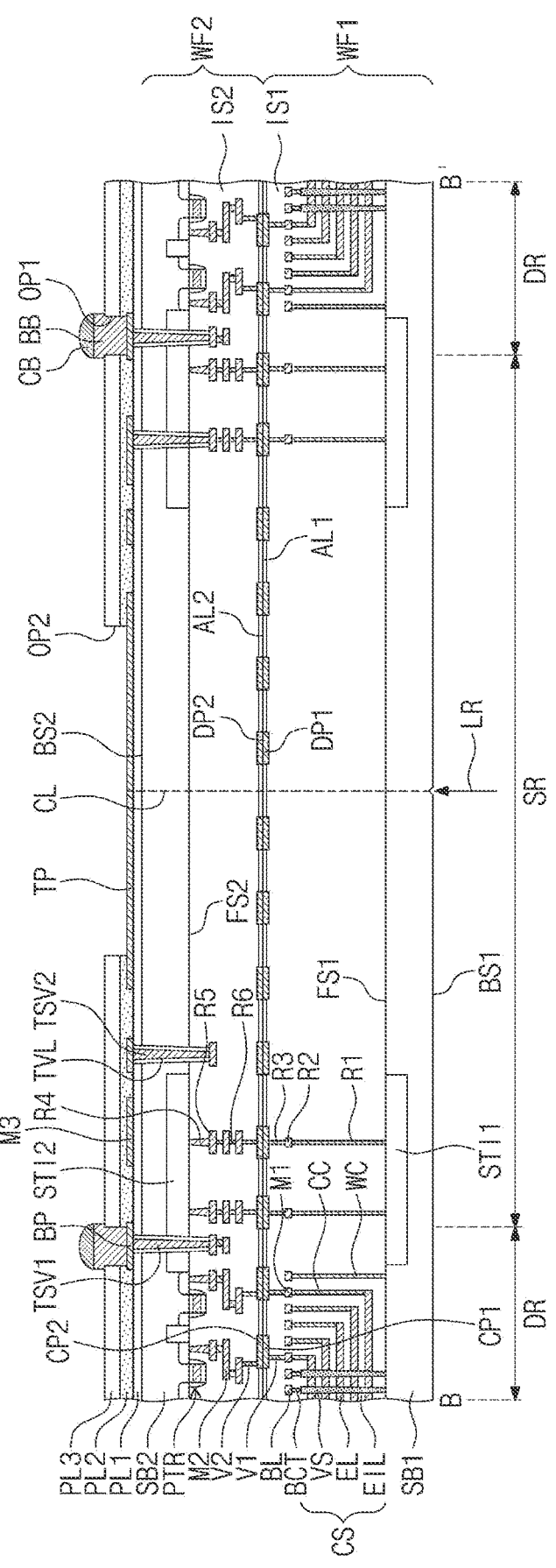

Referring to FIG. 4C, after the test process, the conductive bump BB may be formed in the first opening OP1, and the solder layer CB may be formed on the conductive bump BB. Thereafter, a laser beam LR may be irradiated onto the second surface BS1 of the first substrate SB1 at a center of the scribe lane region SR. The irradiation of the laser beam LR may result in recrystallization of silicon atoms in a region of the first substrate SB1 irradiated with the laser beam LR, and a crack or dislocation may occur in a bonding structure between neighboring silicon atoms.

Figure 4D:
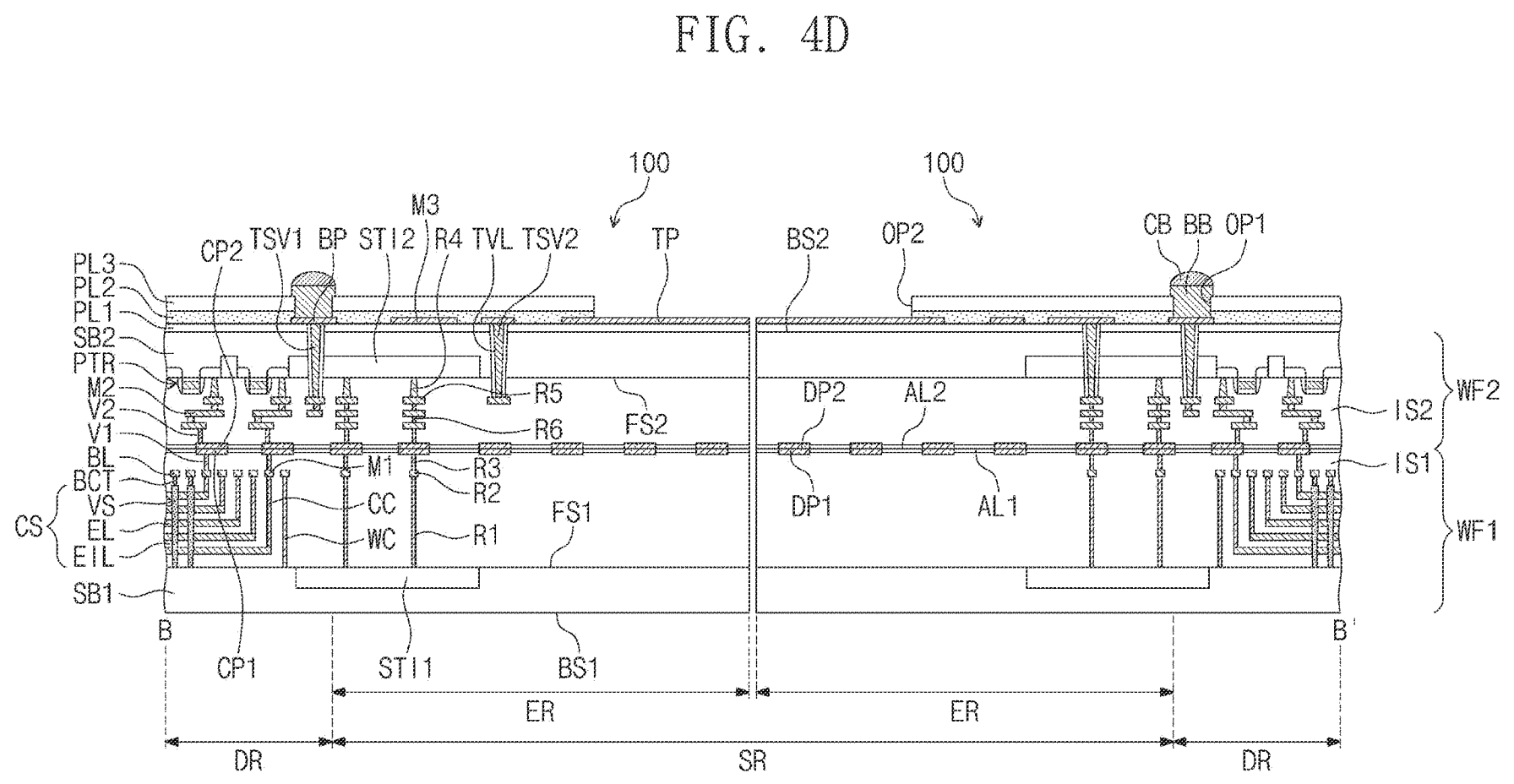

Referring to FIGS. 4C and 4D, a grinding process may be performed on the second surface BS1 of the first substrate SB1. During the grinding process, the crack in the first substrate SB1 may be propagated along a cutting line CL by a frictional force exerted on the first substrate SB1, and as a result, the first and second wafers WF1 and WF2, which are bonded to each other, may be cut into a plurality of semiconductor devices 100. The sawing process, which is performed to form the semiconductor devices 100, may include the laser beam irradiation step and the grinding step. After the sawing process, a portion of the scribe lane region SR may be left as the edge region ER of the semiconductor device 100.

Figure 5:
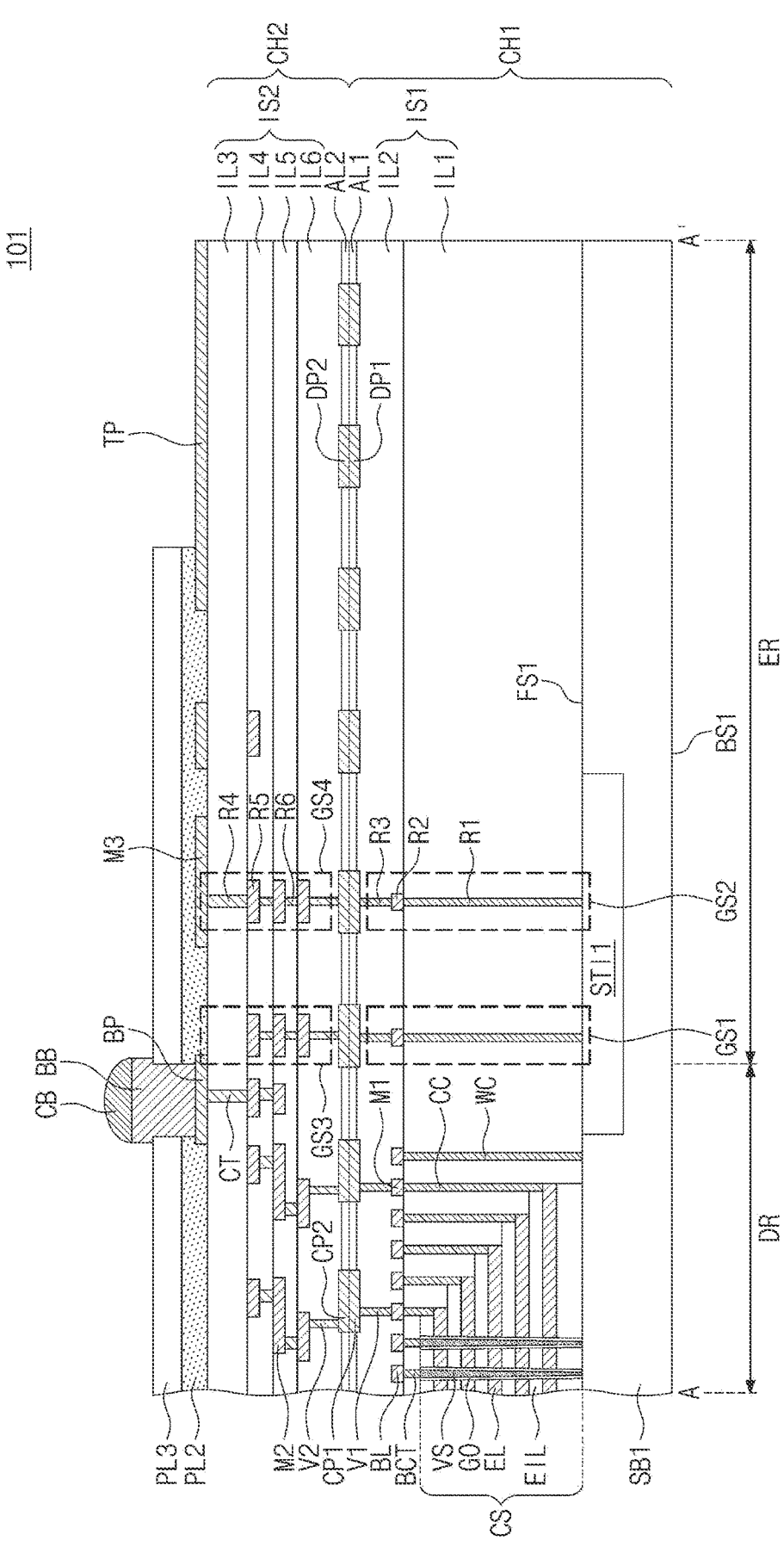
FIG. 5 is a sectional view along the line A-A' of FIG. 1.

FIG. 5 is a sectional view along the line A-A' of FIG. 1.

Referring to FIG. 5, in a semiconductor device 101 according to the present embodiment, the second sub-chip CH2 may not include the second substrate SB2, the peripheral transistors PTR, the second device isolation layer STI2, the first protection layer PL1, the first and second penetration vias TSV1 and TSV2, and the via insulating layer TVL of FIG. 2A. The second sub-chip CH2 may include the second insulating structure IS2, the second adhesive layer AL2, the second interconnection lines M2, the peripheral contacts CT, and the second vias V2. The second protection layer PL2 may be in direct contact with the third interlayer insulating layer IL3 of the second insulating structure IS2. The bonding pad BP, the third interconnection lines M3 and the test pattern TP may be in direct contact with the third interlayer insulating layer IL3 of the second insulating structure IS2. The peripheral contacts CT may connect the bonding pad BP to the second interconnection lines M2. The fourth guard ring structure GS4 may include the fourth to sixth guard rings R4, R5, and R6. The fourth guard ring structure GS4 may be connected to the third interconnection line M3. The fourth guard ring R4 may not be provided in the third guard ring structure GS3. Except for the above features, the semiconductor device may have the same or similar structure as that in the embodiment described with reference to FIG. 2A.

Figure 6:
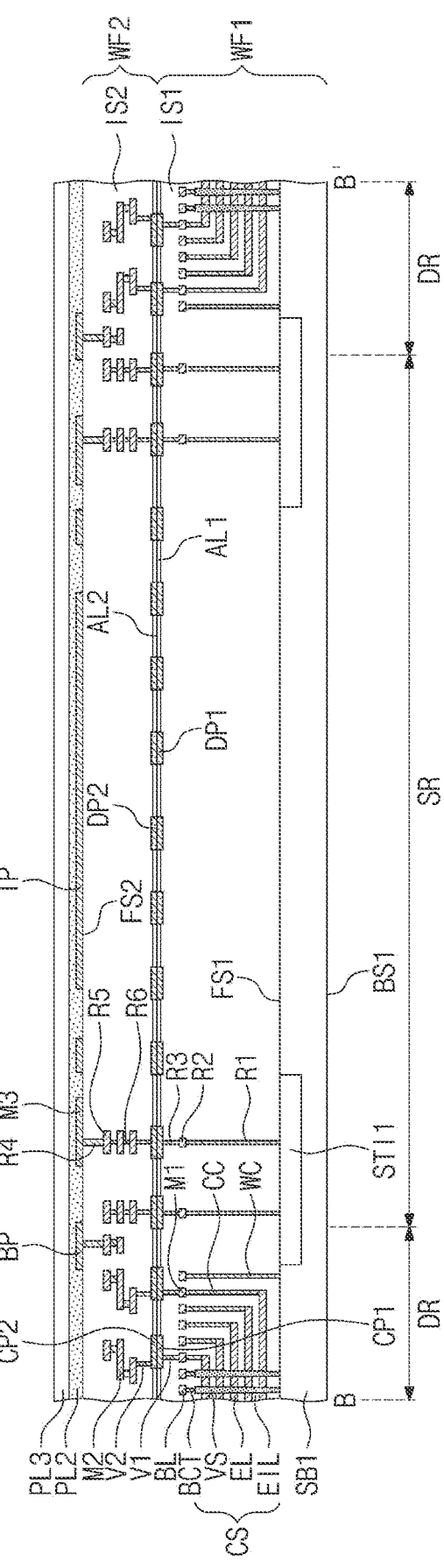
FIG. 6 is a sectional view illustrating a process of fabricating the semiconductor device of FIG. 5.

FIG. 6 is a sectional view illustrating a process of fabricating the semiconductor device of FIG. 5.

The preparation of the second wafer WF2 may be different from that in the embodiment of FIG. 4A. The peripheral transistors PTR and the second device isolation layer STI2 may not be formed on the second substrate SB2 of the second wafer WF2. The second interconnection lines M2, the peripheral contacts CT, the second vias V2, the second insulating structure IS2, the second adhesive layer AL2, the fourth to sixth guard rings R4 to R6, the second metal pads CP2, and the second dummy pads DP2 may be formed on the second substrate SB2 of the second wafer WF2. Next, the second wafer WF2 may be placed on the first wafer WF1 and may be bonded to the first wafer WF1 by applying heat and pressure to the second wafer WF2.

Referring to FIGS. 4A and 6, a grinding process may be performed on the fourth surface BS2 of the second substrate SB2 to fully remove the second substrate SB2 and to expose the third interlayer insulating layer IL3 of the second insulating structure IS2 (i.e., so that the second substrate SB2 is on at least a portion of the third interlayer insulating layer IL3). Next, the bonding pads BP, the third interconnection lines M3, and the test pattern TP may be formed on the third interlayer insulating layer IL3. The second and third protection layers PL2 and PL3 may be sequentially stacked on and the third interlayer insulating layer IL3. The subsequent process may be performed in the same manner as the embodiment of FIGS. 4B to 4D. As a result, the semiconductor device 101 of FIG. 5 may be fabricated.

Figure 7A:
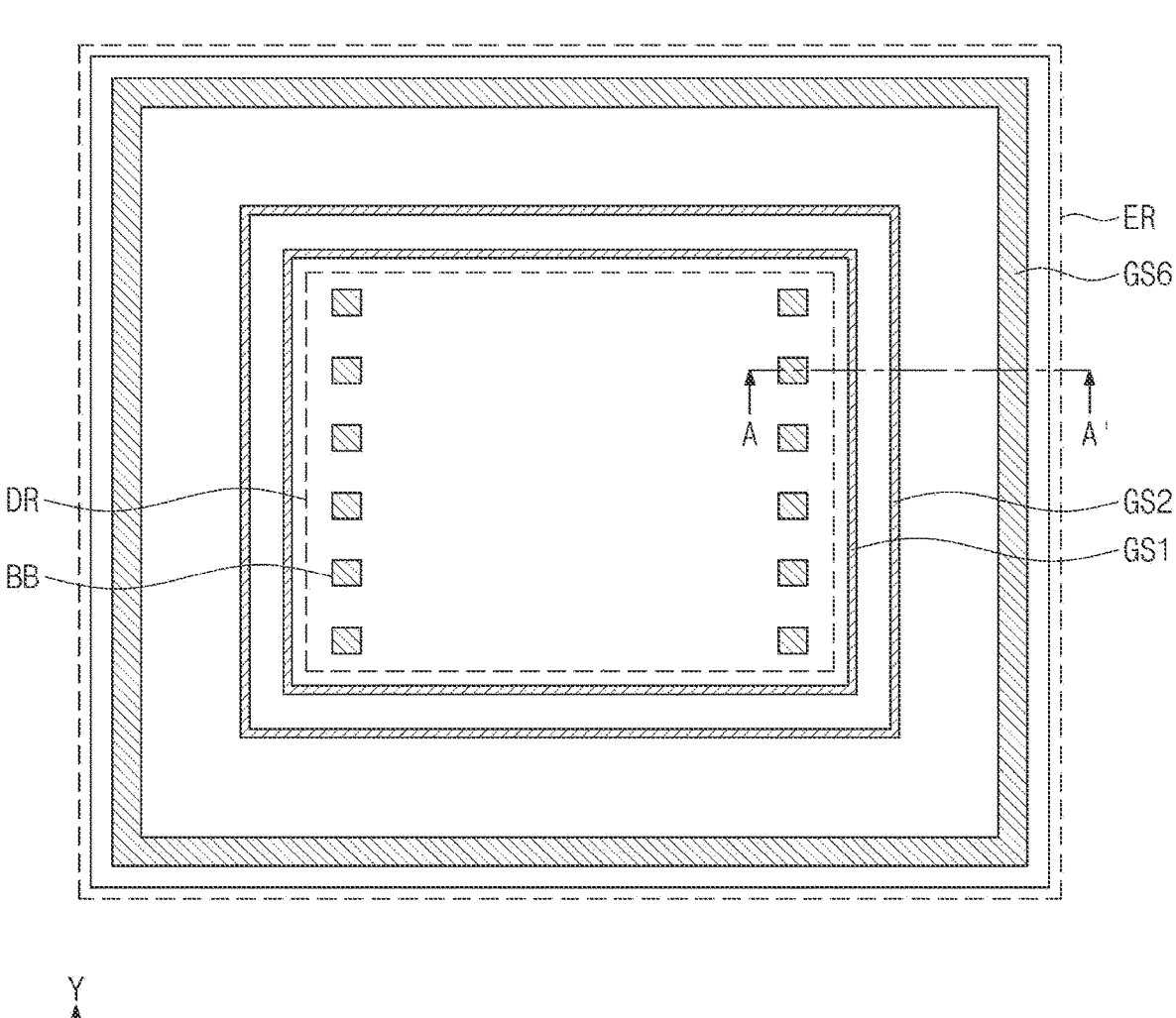
FIGS. 7A and 7B are plan views illustrating a semiconductor device according to some embodiments of the inventive concept.
Figure 7B:
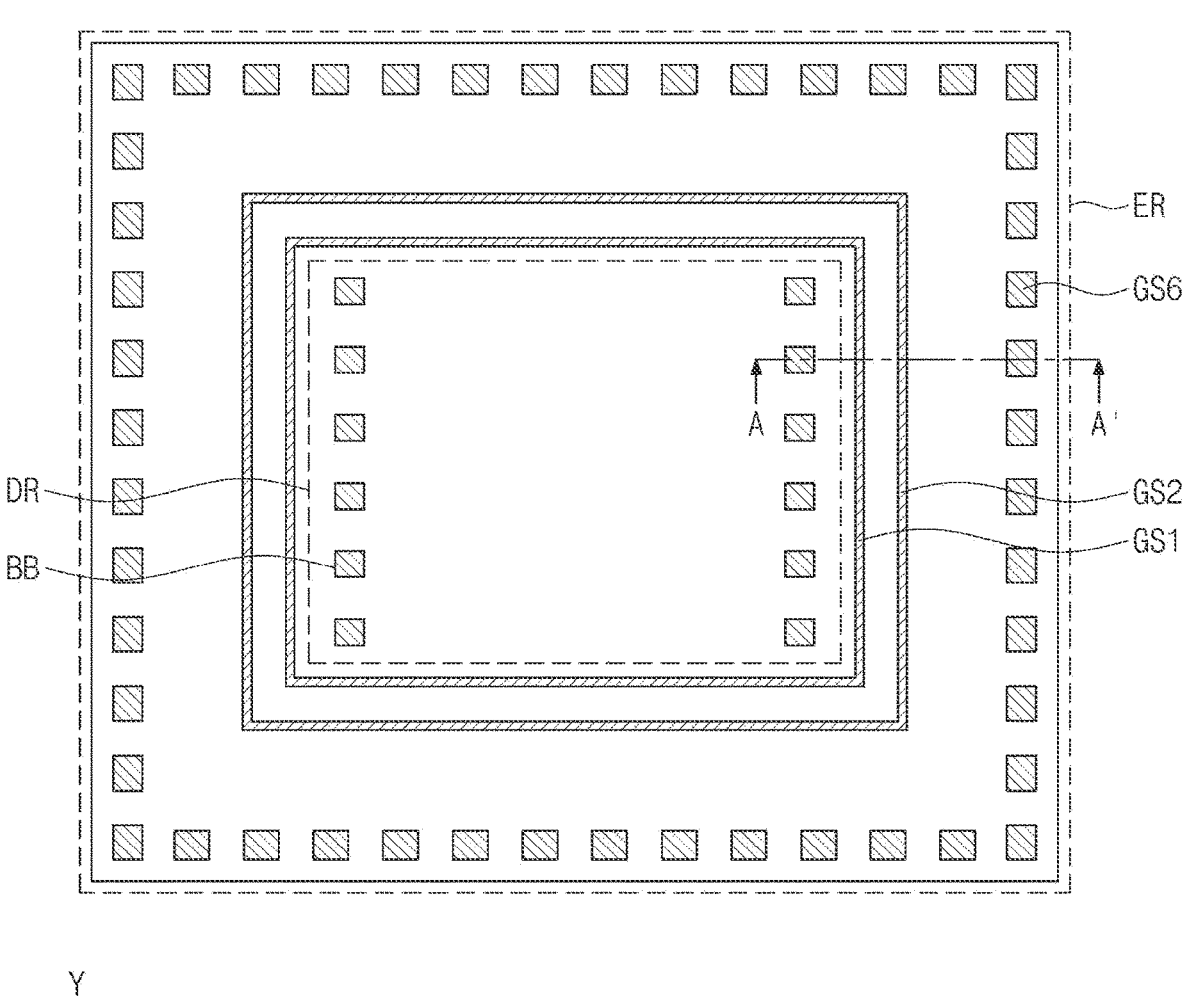
Figure 8:
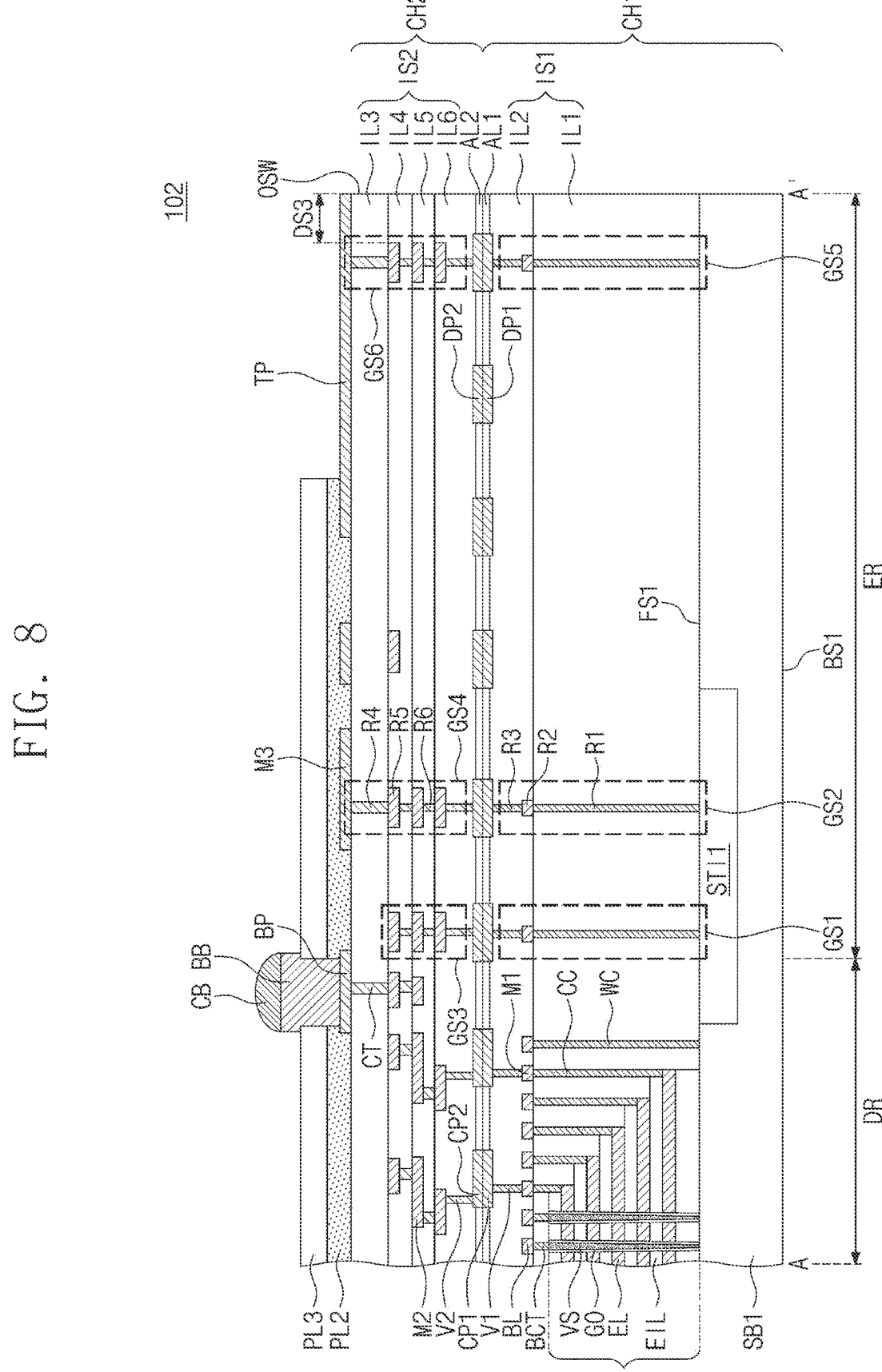
FIG. 8 is a sectional view along the line A-A' of FIG. 7A or 7B.

FIGS. 7A and 7B are plan views illustrating a semiconductor device according to some embodiments of the inventive concept. FIG. 8 is a sectional view along the line A-A' of FIG. 7A or 7B.

Referring to FIGS. 7A, 7B, and 8, a semiconductor device 102 according to the present embodiment may include a fifth guard ring structure GS5 and a sixth guard ring structure GS6, which are adjacent to an outermost sidewall OSW thereof. A third distance DS3 from the outermost sidewall OSW of the semiconductor device 102 to the fifth guard ring structure GS5 and/or the sixth guard ring structure GS6 may range from 0-15 μm. The fifth and sixth guard ring structures GS5 and GS6 may overlap each other. The fifth guard ring structure GS5 may extend into the first sub-chip CH1. The sixth guard ring structure GS6 may extend into the second sub-chip CH2. The fifth guard ring structure GS5 may include the first to third guard rings R1-R3 sequentially stacked. The sixth guard ring structure GS6 may include the fourth to sixth guard rings R4 to R6 sequentially stacked. Each of the fifth and sixth guard ring structures GS5 and GS6 may have a ring-shaped structure enclosing the device region DR, as shown in FIG. 7A. Alternatively, when viewed in a plan view, each of the fifth and sixth guard ring structures GS5 and GS6 may include a plurality of island- or pad-shaped patterns, which are spaced apart from each other and are around a perimeter or outer boundary of the device region DR, for example, to enclose the device region DR, as shown in FIG. 7B. Since the fifth and sixth guard ring structures GS5 and GS6 are near the outermost sidewall OSW of the semiconductor device 102, they may prevent a lateral propagation of a crack from occurring in a sawing step of a fabrication process of the semiconductor device 102. Thus, it may be possible to improve reliability of the semiconductor device 102.

Figure 9A:
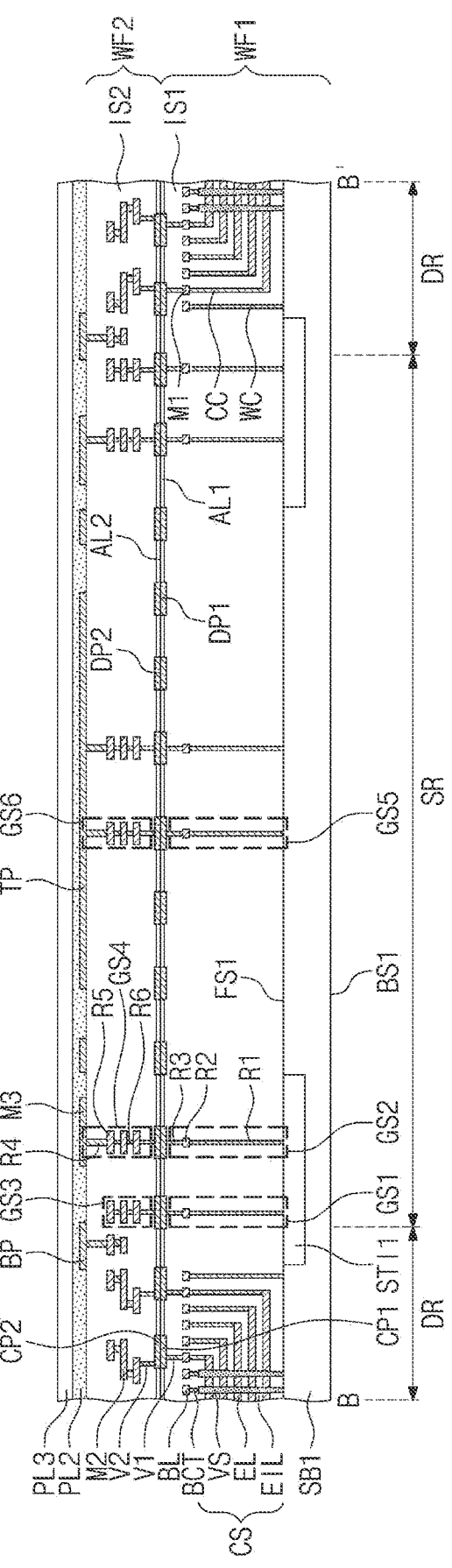
FIGS. 9A and 9B are sectional views illustrating a process of fabricating the semiconductor device of FIG. 8.
Figure 9B:
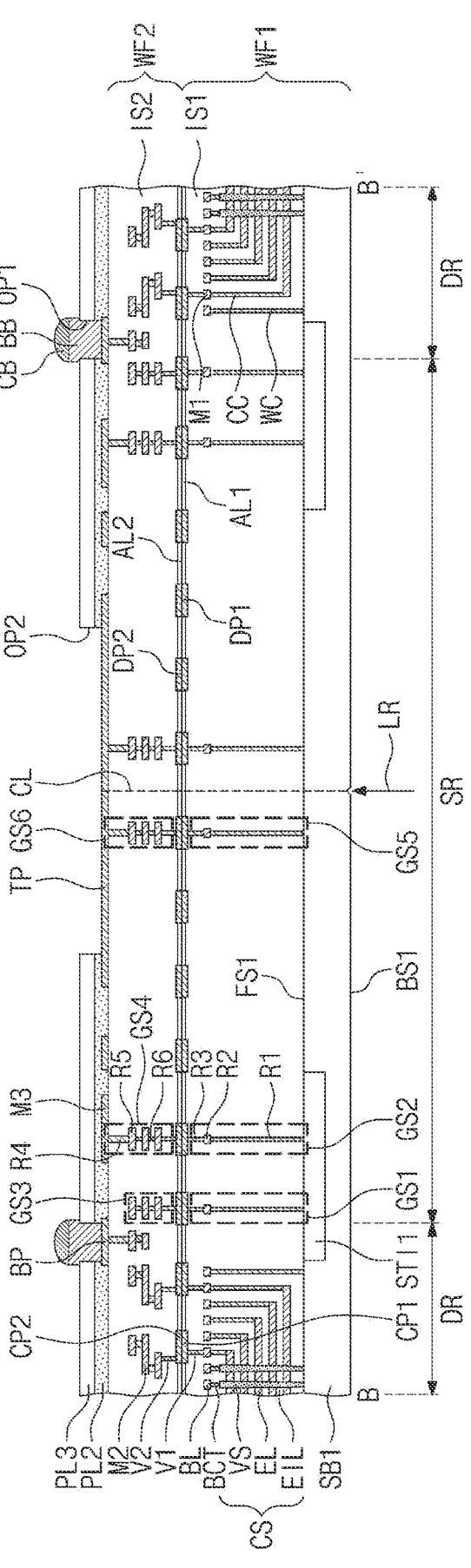

FIGS. 9A and 9B are sectional views illustrating a process of fabricating the semiconductor device of FIG. 8.

Referring to FIGS. 4A and 9A, the first and second wafers WF1 and WF2 may be prepared. The fifth guard ring structure GS5 may be formed when the first and second guard ring structures GS1 and GS2 are formed in the first wafer WF1. The peripheral transistors PTR and the second device isolation layer STI2 may not be formed on the second substrate SB2 of the second wafer WF2. The second interconnection lines M2, the peripheral contacts CT, the second vias V2, the second insulating structure IS2, the second adhesive layer AL2, the fourth to sixth guard rings R4 to R6, the second metal pads CP2, and the second dummy pads DP2 may be formed on the second substrate SB2 of the second wafer WF2. The sixth guard ring structure GS6 may be formed when the third and fourth guard ring structures GS3 and GS4 are formed in the second wafer WF2. Next, the second wafer WF2 may be placed on the first wafer WF1 and may be bonded to the first wafer WF1 by applying heat and pressure to the second wafer WF2.

Referring to FIG. 9B, a grinding process may be performed on the fourth surface BS2 of the second substrate SB2 to fully remove the second substrate SB2 and to expose the third interlayer insulating layer IL3 of the second insulating structure IS2 (i.e., so that the second substrate SB2 is not on the third interlayer insulating layer IL3). Next, the bonding pads BP, the third interconnection lines M3, and the test pattern TP may be formed on the third interlayer insulating layer IL3. The second and third protection layers PL2 and PL3 may be sequentially stacked on the third interlayer insulating layer IL3. The third and second protection layers PL3 and PL2 may be patterned to form the first opening OP1 exposing the bonding pad BP and the second opening OP2 exposing the test pattern TP, i.e., so that the third and second protection layers PL3 and PL2 are not on at least a portion of a top surface of the bonding pad BP and the test pattern TP. The test process may be performed through the second opening OP2.

After the test process, the conductive bump BB may be formed in the first opening OP1, and the solder layer CB may be formed on the conductive bump BB. Next, a sawing process may be performed; for example, the laser beam LR may be irradiated onto the second surface BS1 of the first substrate SB1 at the center of the scribe lane region SR, and then, the grinding step may be performed. During the grinding process, the crack in the first substrate SB1 may be propagated along the cutting line CL by a frictional force exerted on the first substrate SB1, and as a result, the first and second wafers WF1 and WF2, which are bonded to each other, may be divided into the semiconductor devices 102 of FIG. 8. Since the fifth and sixth guard ring structures GS5 and GS6 are adjacent to the cutting line CL, they may be used to prevent the lateral propagation of the crack in the sawing process. Accordingly, it may be possible to reduce a failure in the semiconductor device 102 and thereby to improve reliability of the semiconductor device 102.

Figure 10:
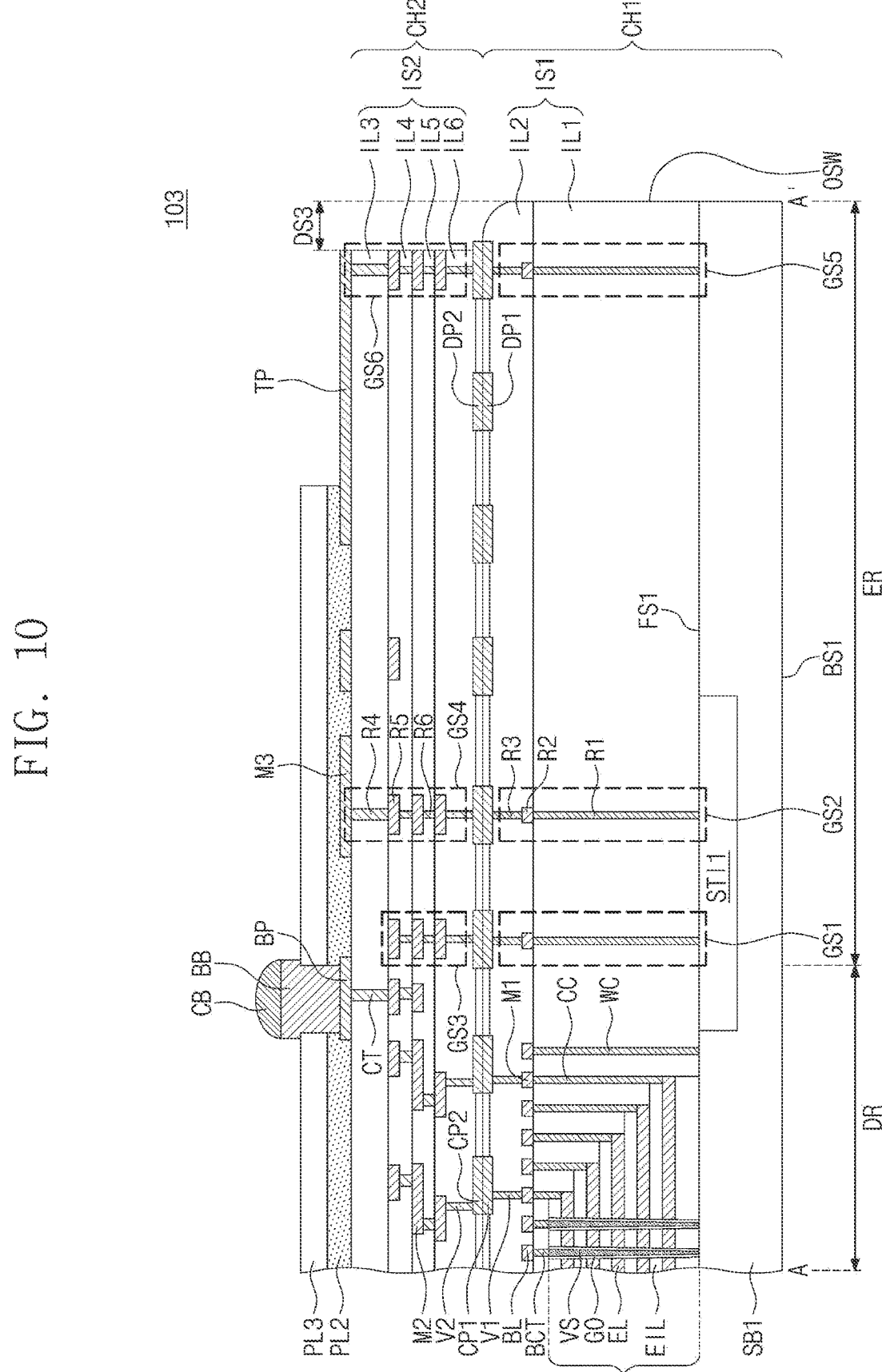
Figure 11:
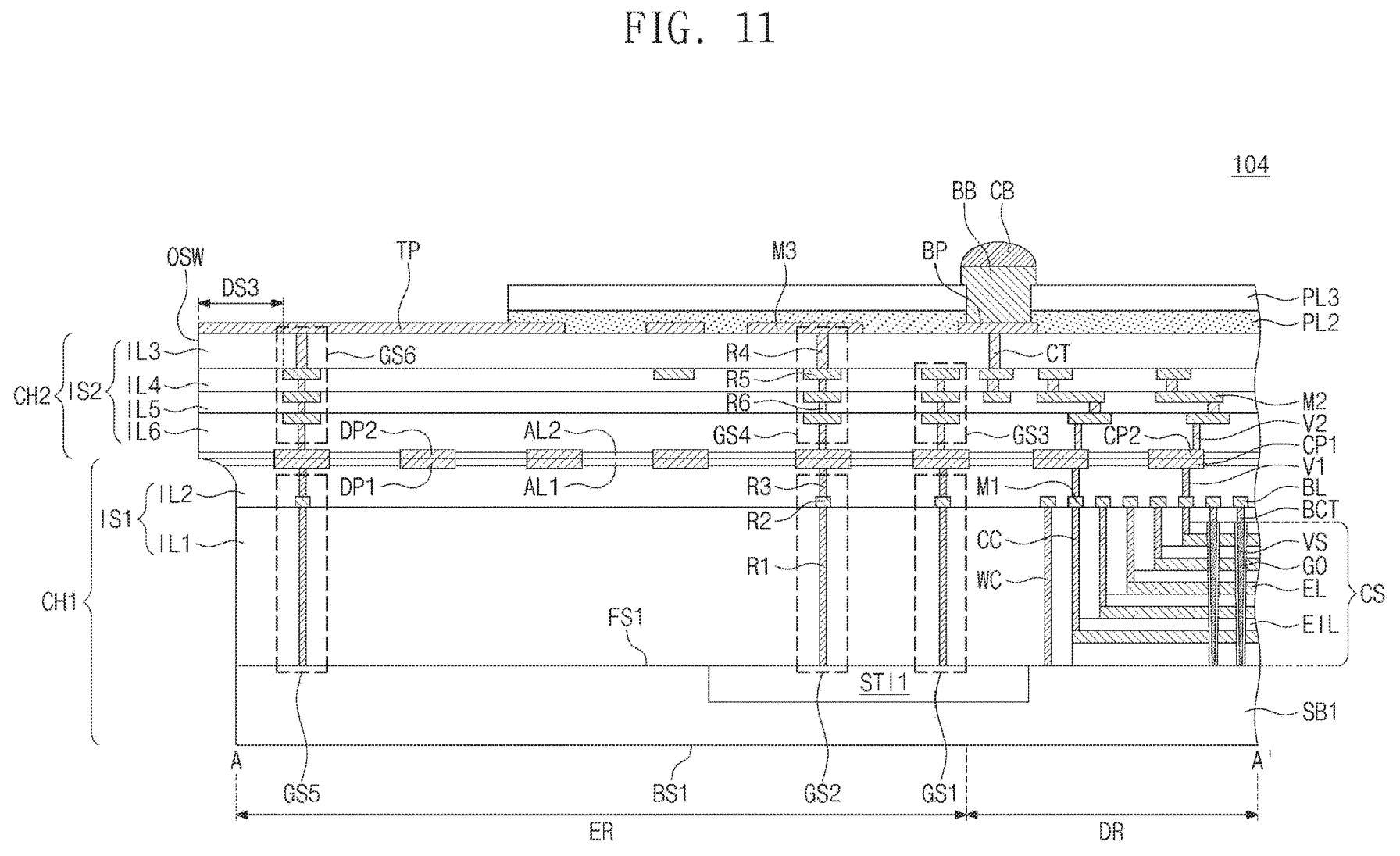

FIGS. 10 and 11 are sectional views along the line A-A' of FIG. 7A or FIG. 7B.

Referring to FIGS. 10 and 11, semiconductor devices 103 and 104 according to the present embodiment may include fifth and sixth guard ring structures GS5 and GS6, which are adjacent to the outermost sidewall OSW. The third distance DS3 from the outermost sidewall OSW of the semiconductor devices 103 and 104 to the fifth guard ring structure GS5 and/or the sixth guard ring structure GS6 may range from 0-15 μm. In the semiconductor devices 103 and 104, the outermost sidewall OSW may have a non-flat portion. As shown in FIG. 10, the outer sidewall of the first insulating structure IS1 may protrude laterally from the outer sidewall of the second insulating structure IS2. Here, a side surface of the sixth guard ring structure GS6 may be exposed. Alternatively, as shown in FIG. 11, the outer sidewall of the second insulating structure IS2 may protrude laterally from the outer sidewall of the first insulating structure IS1. In this case, the outer sidewalls of the fifth and sixth guard ring structures GS5 and GS6 may not be exposed and may be covered with the first and second insulating structures IS1 and IS2, e.g., so that the first and second insulating structures IS1 and IS2 are on the outer sidewalls of the fifth and sixth guard ring structures GS5 and GS6.

Figure 12:
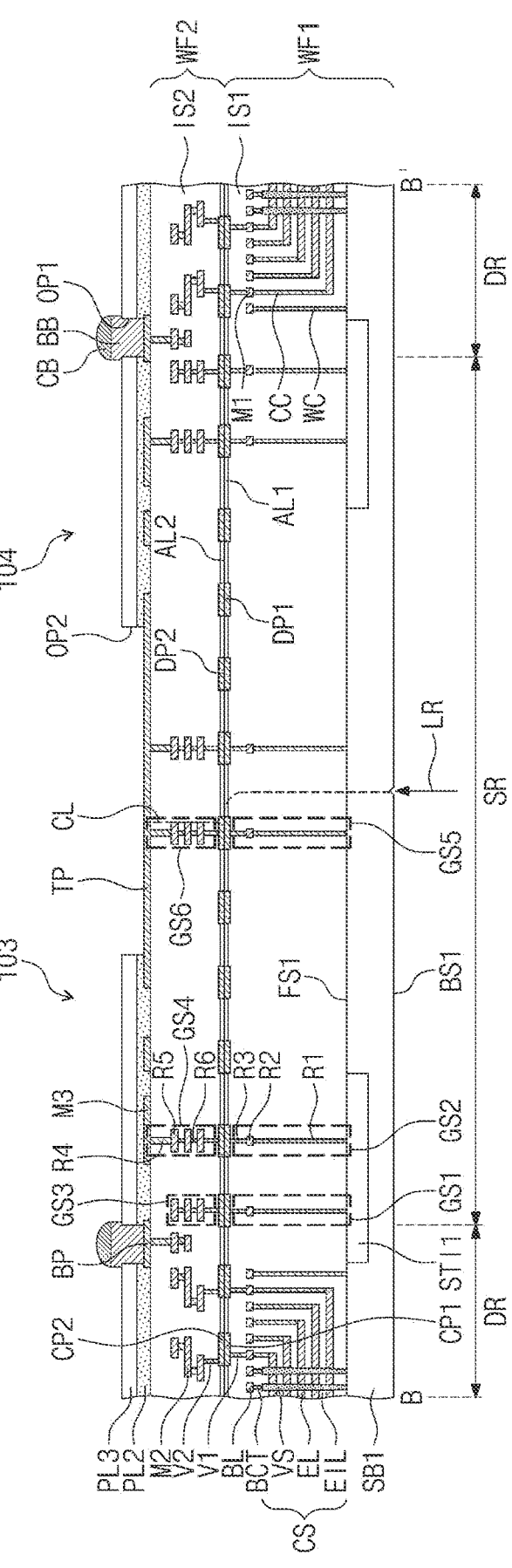
FIG. 12 is a sectional view illustrating a process of fabricating the semiconductor device of FIG. 10 and/or FIG. 11.

FIG. 12 is a sectional view illustrating a process of fabricating the semiconductor device of FIG. 10 and/or FIG. 11.

Referring to FIG. 12, the process may be performed in a similar manner to that in the embodiment described with reference to FIGS. 9A and 9B. The conductive bump BB and the solder layer CB may be formed, and then, a sawing process may be performed. For example, during the sawing process, the laser beam LR may be irradiated onto the second surface BS1 of the first substrate SB1 at a center of the scribe lane region SR, and the grinding process may be performed on the wafer, as described above. A crack in the first substrate SB1 may be laterally propagated by a frictional force, which is exerted on the resulting structure during the grinding process. For all that, the lateral propagation of the crack may be blocked by the fifth and sixth guard ring structures GS5 and GS6, and in particular, the sixth guard ring structure GS6 may lead to a vertical propagation of the crack. As a result, the cutting line CL may be bent, as shown in FIG. 12. After the sawing process, the left portion in FIG. 12 may be used as the semiconductor device 103 of FIG. 10, and the right portion in FIG. 12 may be used as the semiconductor device 104 of FIG. 11.

Figure 13:
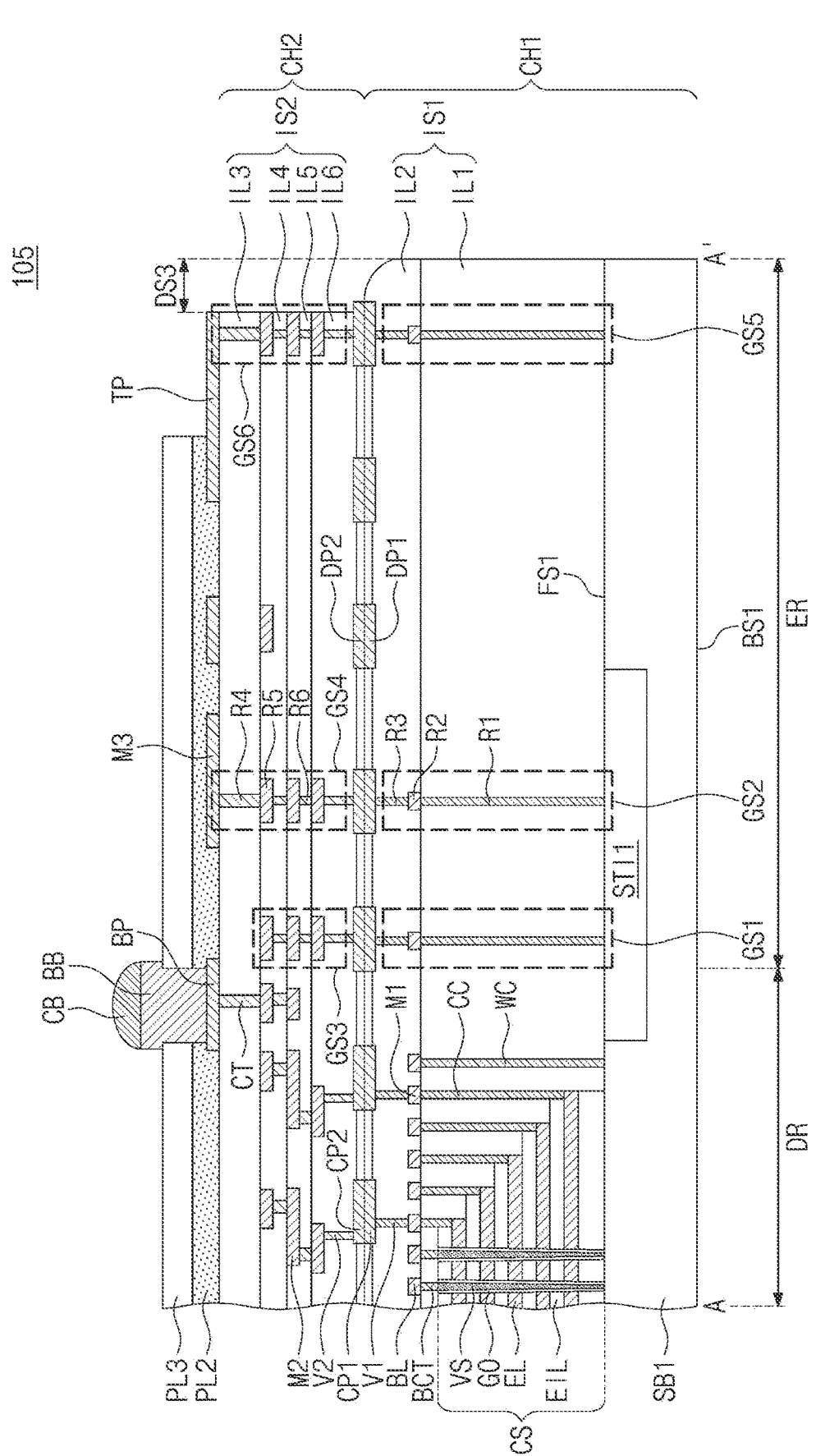
FIGS. 13 and 14 are sectional views along the line A-A' of FIG. 7A or 7B.
Figure 14:
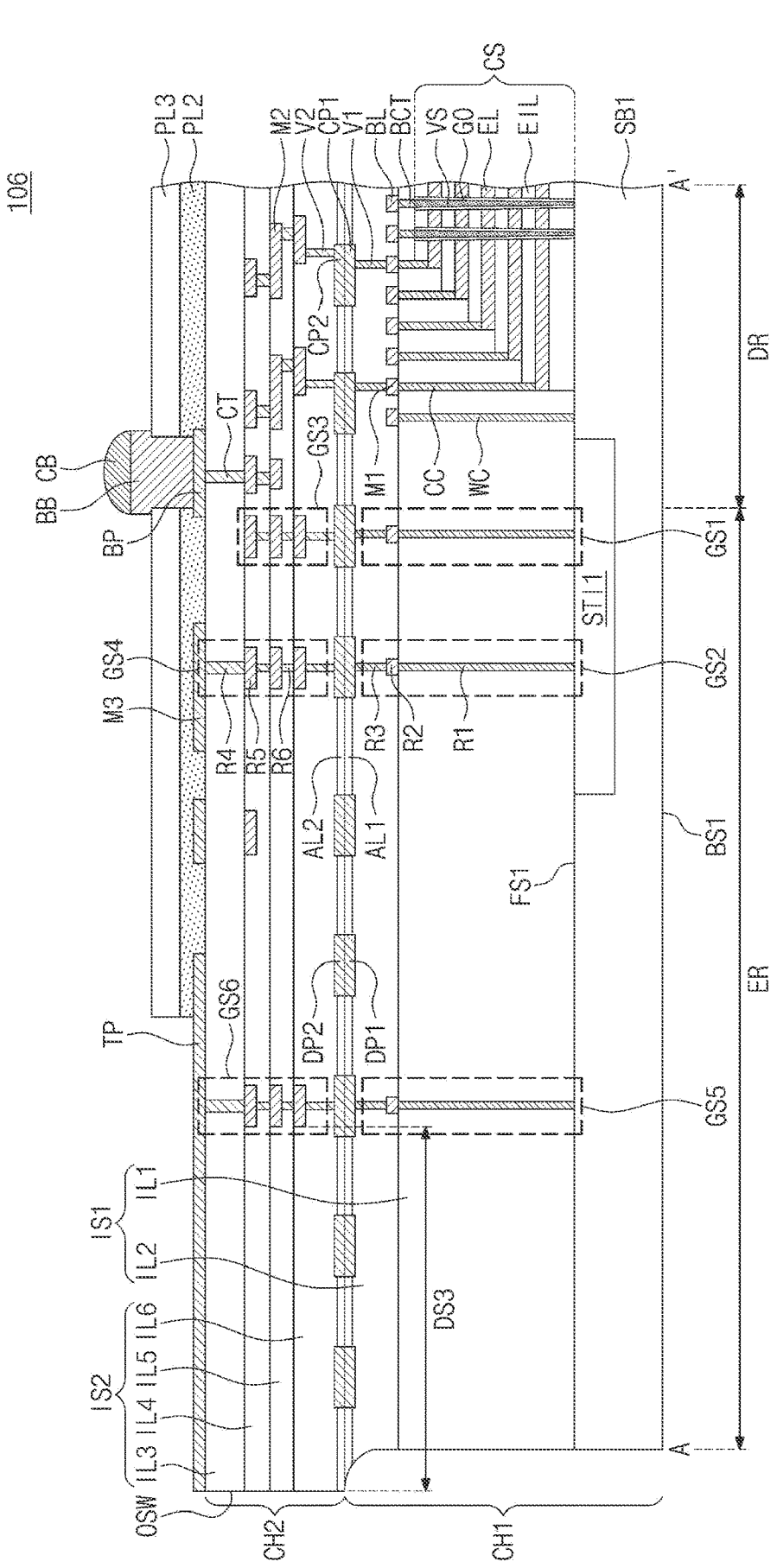

FIGS. 13 and 14 are sectional views along the line A-A' of FIG. 7A or FIG. 7B.

Referring to FIGS. 13 and 14, semiconductor devices 105 and 106 according to the present embodiment may include a fifth guard ring structure GS5 and a sixth guard ring structure GS6, which are adjacent to the outermost sidewall OSW. The semiconductor device 105 of FIG. 13 may be substantially similar to the semiconductor device 103 of FIG. 10, except that the number of the second dummy pads DP2 between the fourth and sixth guard ring structures GS4 and GS6 is less than that in FIG. 10. The semiconductor device 106 of FIG. 14 may be substantially similar to the semiconductor device 104 of FIG. 11, but the first and second dummy pads DP1 and DP2 may be additionally between the fifth and sixth guard ring structures GS5 and GS6 and the outermost sidewall OSW. Except for the above features, the semiconductor device may have the same or similar structure as that in the embodiment described with reference to FIGS. 10 and 11.

Figure 15:
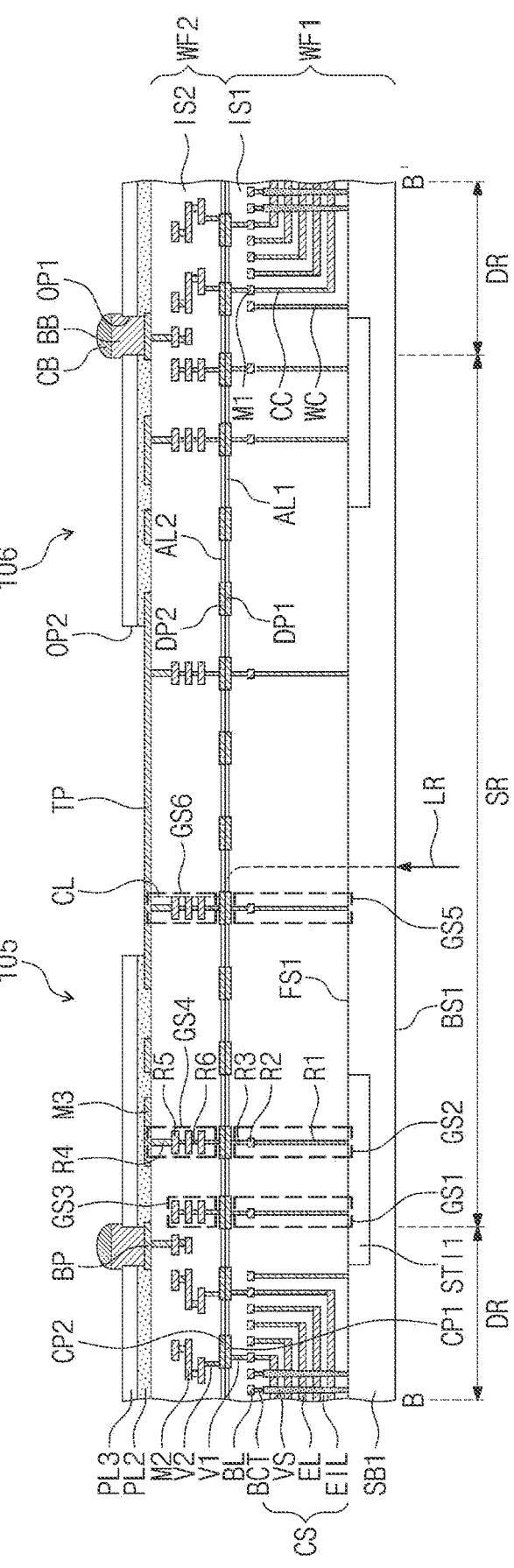
FIG. 15 is a sectional view illustrating a process of fabricating the semiconductor device of FIG. 13 and/or FIG. 14.

FIG. 15 is a sectional view illustrating a process of fabricating the semiconductor device of FIG. 13 and/or FIG. 14.

Referring to FIG. 15, when the first and second wafers WF1 and WF2 are formed, the first and second dummy pads DP1 and DP2 may be formed to be placed at the center of the scribe lane region SR, as in the embodiment of FIG. 9A. That is, in the scribe lane region SR, the first dummy pads DP1 may be between adjacent ones of the fifth guard ring structures GS5. Furthermore, in the scribe lane region SR, the second dummy pads DP2 may be between adjacent ones of the sixth guard ring structures GS6. The conductive bump BB and the solder layer CB may be formed, and then, the sawing process may be performed. For example, during the sawing process, the laser beam LR may be irradiated onto the second surface BS1 of the first substrate SB1 at a center of the scribe lane region SR, and the grinding process may be performed on the wafer, as described above. A crack in the first substrate SB1 may be laterally propagated by a frictional force, which is exerted on the resulting structure during the grinding process. For all that, the lateral propagation of the crack may be blocked by the fifth and sixth guard ring structures GS5 and GS6, and in particular, the sixth guard ring structure GS6 may lead to a vertical propagation of the crack. As a result, the cutting line CL may be bent, as shown in FIG. 15. After the sawing process, the left portion in FIG. 15 may be used as the semiconductor device 105 of FIG. 13, and the right portion in FIG. 15 may be used as the semiconductor device 106 of FIG. 14.

Figure 16:
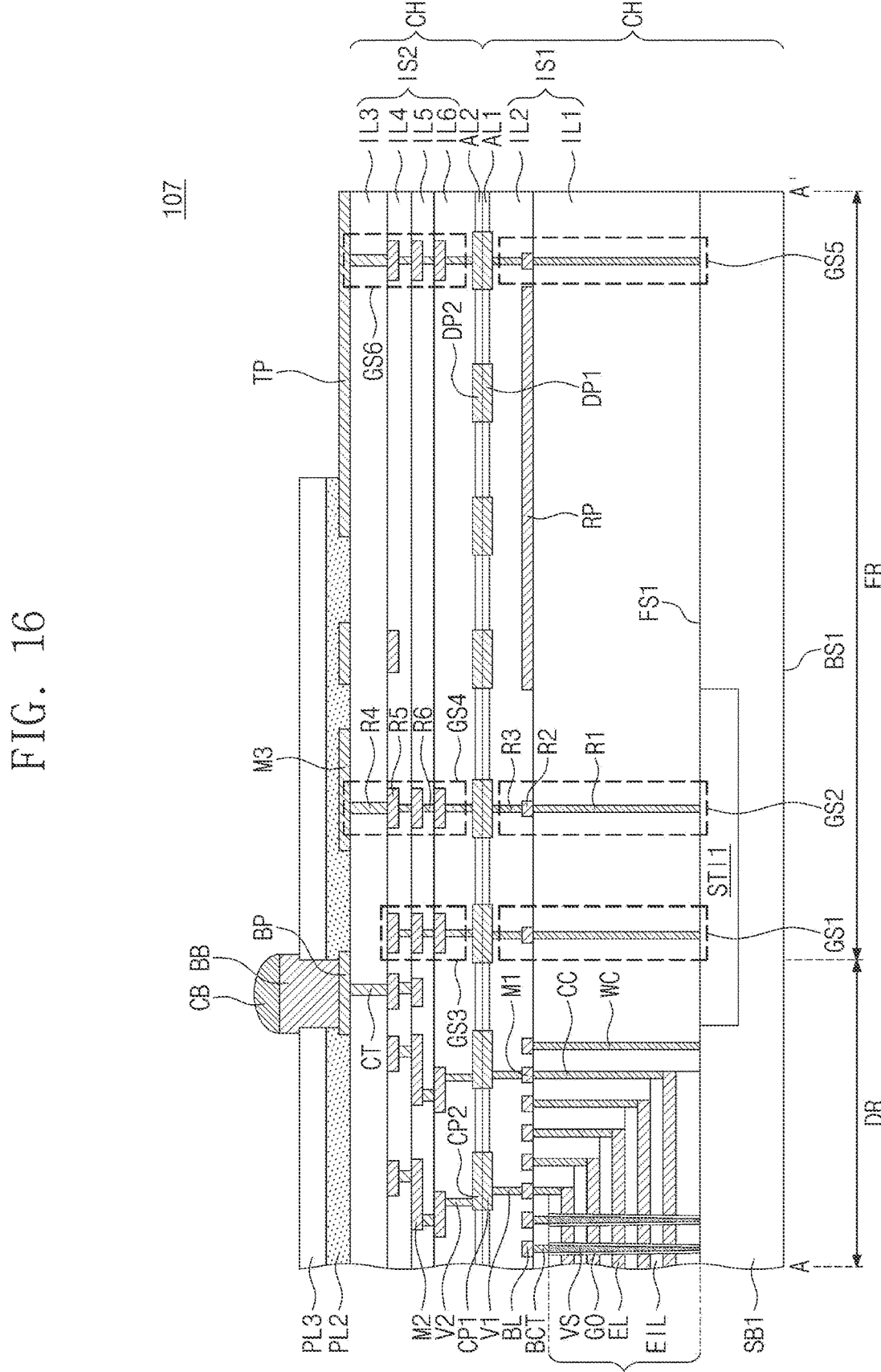
FIG. 16 is a sectional view along the line A-A' of FIG. 7A or 7B.

FIG. 16 is a sectional view along the line A-A' of FIG. 7A or FIG. 7B.

Referring to FIG. 16, a semiconductor device 107 according to the present embodiment may further include a scattering beam blocking pattern RP, which is in the first insulating structure IS1, compared with the structure of FIG. 8. The scattering beam blocking pattern RP may overlap the first and second dummy pads DP1 and DP2. The scattering beam blocking pattern RP may not be connected to (e.g., be electrically isolated from) the first and second dummy pads DP1 and DP2 and may be electrically disconnected or isolated from the first and second dummy pads DP1 and DP2. The scattering beam blocking pattern RP may be formed of or include at least one of metallic materials. In some embodiments, the scattering beam blocking pattern RP may have the same thickness and height as the first interconnection line M1. FIG. 16 illustrates an example, in which the scattering beam blocking pattern RP is on the edge region ER, but in some embodiments, the scattering beam blocking pattern RP may be on the device region DR. Here, the scattering beam blocking pattern RP may overlap the first and second metal pads CP1 and CP2. Since the scattering beam blocking pattern RP is provided, in the semiconductor device 107 according to the present embodiment may have improved reliability.

Figure 17:
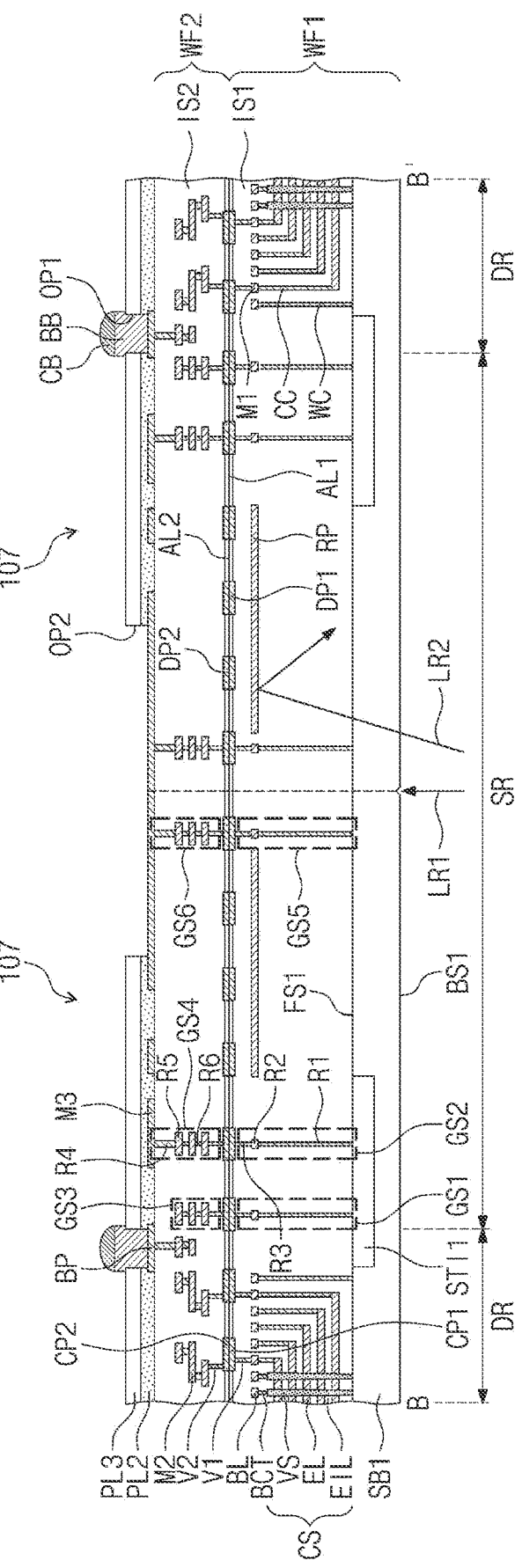
FIG. 17 is a sectional view illustrating a process of fabricating the semiconductor device of FIG. 16.

FIG. 17 is a sectional view illustrating a process of fabricating the semiconductor device of FIG. 16.

Referring to FIG. 17, when, in the sawing process, a laser beam LR1 is irradiated into the wafer, a fraction LR2 of the laser beam LR1 may be scattered to propagate toward the first and second dummy pads DP1 and DP2 and/or the first and second metal pads CP1 and CP2. If the scattered laser beam LR2 is incident into the first and second dummy pads DP1 and DP2 and/or the first and second metal pads CP1 and CP2, the first and second dummy pads DP1 and DP2 and/or the first and second metal pads CP1 and CP2 may be melted, and this may result in a bonding failure. However, according to some embodiments of the inventive concept, the scattering beam blocking pattern RP may prevent the scattered laser beam LR2 from being incident into the first and second dummy pads DP1 and DP2 and/or the first and second metal pads CP1 and CP2. The scattering beam blocking pattern RP may be configured to absorb or reflect the scattered laser beam LR2. Accordingly, it may be possible to reduce a bonding failure and thereby to fabricate the semiconductor device 107 with improved reliability.

Figure 18:
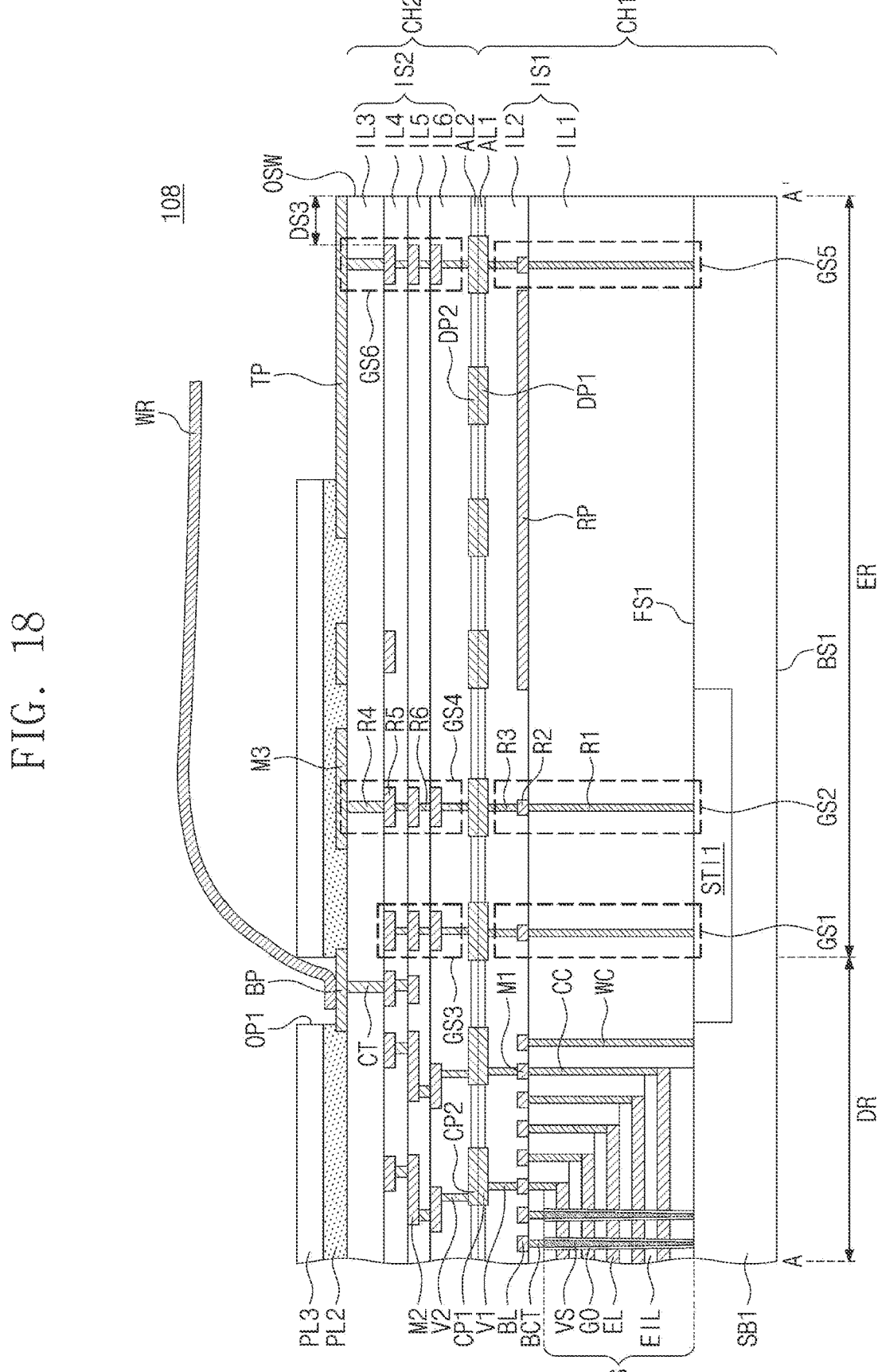
FIG. 18 is a sectional view along the line A-A' of FIG. 7A or 7B.

FIG. 18 is a sectional view along the line A-A' of FIG. 7A or FIG. 7B.

Referring to FIG. 18, a semiconductor device 108 according to the present embodiment may have a structure, in which the conductive bumps BB and the solder layer CB are not provided, compared with the semiconductor device 102 of FIG. 8. The bonding pads BP may be exposed through the first opening OP1. For example, a portion of the second and third protection layers PL2 and PL3 may be removed so that at least a top surface of the bonding pads BP does not have the second and third protection layers PL2 and PL3 thereon. A wire WR may be bonded to the bonding pad BP. Except for the afore-described differences, the semiconductor device may have substantially the same or similar features as those in the embodiment of FIG. 8.

Figure 19:
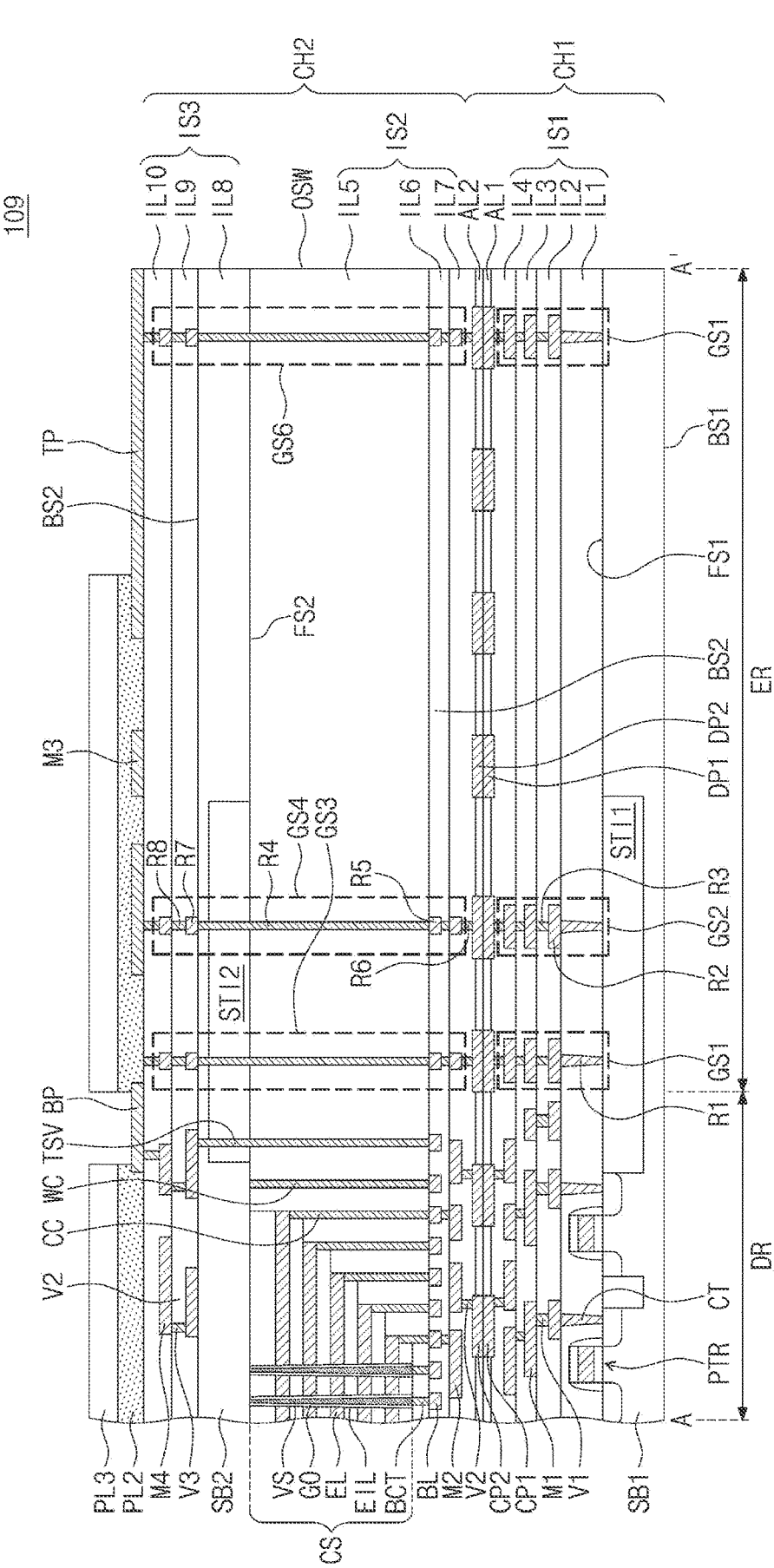
FIG. 19 is a sectional view along the line A-A' of FIG. 7A or 7B.

FIG. 19 is a sectional view along the line A-A' of FIG. 7A or FIG. 7B.

Referring to FIG. 19, a semiconductor device 109 according to the present embodiment may include a first sub-chip CH1 and a second sub-chip CH2, which are bonded to each other. The first sub-chip CH1 may include a first substrate SB1 and a first insulating structure IS1, which is provided on (e.g., to cover) a first surface FS1 of the first substrate SB1. In the device region DR of the first substrate SB1, the peripheral transistors PTR may be on the first surface FS1. The first insulating structure IS1 may include first to fourth interlayer insulating layers IL1-IL4 sequentially stacked. The first to fourth interlayer insulating layers IL1-IL4 may be formed of or include at least one of silicon oxide, silicon nitride, silicon oxynitride, or porous insulating materials and may have a single- or multi-layered structure. The peripheral contacts CT may be in the first interlayer insulating layer IL1. The first interconnection lines M1 may be between the first to fourth interlayer insulating layers IL1-IL4. The first vias V1 may be in the first to fourth interlayer insulating layers IL1-IL4. The fourth interlayer insulating layer IL4 may be on or covered with the first adhesive layer AL1. The first metal pads CP1 may be in the first adhesive layer AL1.

The second sub-chip CH2 may include a second substrate SB2, a second insulating structure IS2 on or covering a third surface FS2 thereof, and a third insulating structure IS3 on or covering a fourth surface BS2 thereof. The second device isolation layer ST2 may be in the second substrate SB2. In the device region DR of the second substrate SB2, the memory cell stack CS may be on the third surface FS2. The memory cell stack CS may be configured to have the same or similar features as that in the embodiment of FIG. 2A.

The second insulating structure IS2 may include fifth to ninth interlayer insulating layers IL5-IL9 sequentially stacked. Each of the fifth to seventh interlayer insulating layers IL5-IL7 may be formed of or include at least one of silicon oxide, silicon nitride, silicon oxynitride, or porous insulating materials and may have a single- or multi-layered structure. The fifth interlayer insulating layer IL5 may be on or cover the memory cell stack CS. The bit line contacts BCT may extend into the fifth interlayer insulating layer IL5 and to be in contact with the vertical semiconductor patterns VS. The cell contacts CC may extend into the fifth interlayer insulating layer IL5 and the inter-electrode insulating layers EIL and to be in contact with the end portions of the electrode layers EL, respectively. The well contact WC may extend into the fifth interlayer insulating layer IL5 and to be in contact with the second substrate SB2.

In the device region DR, the bit lines BL and the second interconnection lines M2 may be on the fifth interlayer insulating layer IL5. The bit lines BL may be connected to the bit line contacts BCT. The second interconnection lines M2 may be connected to the cell contacts CC and the well contact WC. The sixth and seventh interlayer insulating layers IL6 and IL7 may be on or cover the bit lines BL and the second interconnection lines M2. The second interconnection lines M2 may be connected to the second metal pads CP2 through the second vias V2. A bottom surface of the seventh interlayer insulating layer IL7 may be in contact with the second adhesive layer AL2.

The third insulating structure IS3 may include eighth to tenth interlayer insulating layers IL8, IL9, and IL10. The eighth interlayer insulating layer IL8 may be in contact with the second substrate SB2. Fourth interconnection lines M4 and third vias V3 may be in the eighth to tenth interlayer insulating layers IL8, IL9, and IL10. The bonding pads BP and the third interconnection lines M3 may be on the tenth interlayer insulating layer IL10. The tenth interlayer insulating layer IL10 may be on or covered with the second and third protection layers PL2 and PL3.

A penetration via TSV may extend into the fifth interlayer insulating layer IL5, second device isolation layer ST1 and to connect one of the second interconnection lines M2 to a corresponding or respective one of the fourth interconnection lines M4.

In the edge region ER, a first guard ring structure GS1 and a second guard ring structure GS2 may be in the first insulating structure IS1. Each of the first and second guard ring structures GS1 and GS2 may include a first guard ring R1, a second guard ring R2, and a third guard ring R3 sequentially stacked. The first guard ring R1 may have the same height as the peripheral contact CT and may extend into the first interlayer insulating layer IL1 and may be around a perimeter or outer boundary of the device region DR, for example, to enclose the device region DR in a plan view. The second guard ring R2 may be located at the same height as the first interconnection lines M1 and may have the same thickness as the first interconnection lines M1. The second guard ring R2 may have the same height as the first vias V1 and may extend into the second interlayer insulating layer IL2. Each of the second and third guard rings R2 and R3 may be around a perimeter or outer boundary of the device region DR, for example, to enclose the device region DR, when viewed in a plan view.

In the edge region ER, the third and fourth guard ring structures GS3 and GS4 may be in the second and third insulating structures IS2 and IS3. Each of the third and fourth guard ring structures GS3 and GS4 may include fourth to eighth guard rings R4 to R8. The fourth guard ring R4 may have the same height as the penetration via TSV and may be around a perimeter or outer boundary of the device region DR, for example, to enclose the device region DR.

The fifth guard rings R5 may be located at the same height as the second interconnection lines M2 and may have the same thickness as the second interconnection lines M2. The sixth guard rings R6 may have the same height as the second vias V2. The seventh guard rings R7 may be located at the same height as the fourth interconnection lines M4 and may have the same thickness as the fourth interconnection lines M4. The eighth guard rings R8 may have the same height as the third vias V3. Each of the fourth to eighth guard rings R4 to R8 may be around a perimeter or outer boundary of the device region DR, for example, to enclose the device region DR, when viewed in a plan view. The semiconductor device 109 according to the present embodiment may further include the fifth and sixth guard ring structures GS5 and GS6, which are adjacent to the outermost sidewall OSW. Except for the afore-described differences, the semiconductor device may have substantially the same or similar features as those in the previous embodiments.

Figure 20:
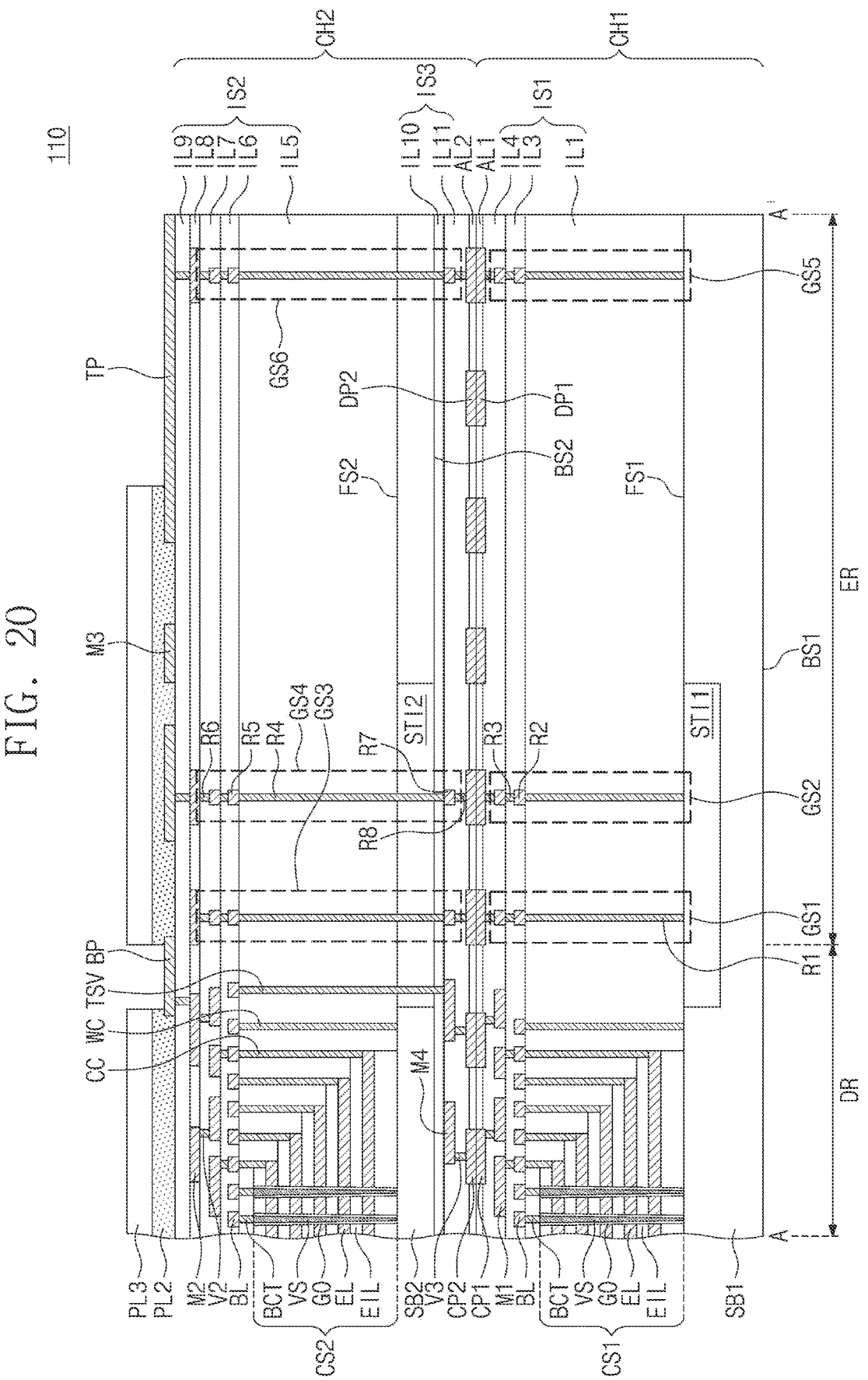
FIG. 20 is a sectional view along the line A-A' of FIG. 7A or 7B.

FIG. 20 is a sectional view along the line A-A' of FIG. 7A or FIG. 7B.

Referring to FIG. 20, a semiconductor device 110 according to the present embodiment may include a first sub-chip CH1 and a second sub-chip CH2, which are bonded to each other. The first sub-chip CH1 may include a first substrate SB1 and a first insulating structure IS1 may be on or cover a first surface FS1 of the first substrate SB1. In the device region DR of the first substrate SB1, a first memory cell stack CS1 may be on the first surface FS1. The second sub-chip CH2 may include the second substrate SB2, and the second insulating structure IS2 may be on or cover the third surface FS2 thereof, and the third insulating structure IS3 may be on or cover the fourth surface BS2 thereof. The second device isolation layer ST2 may be in the second substrate SB2. In the device region DR of the second substrate SB2, a second memory cell stack CS2 may be on the third surface FS2. The first and second memory cell stacks CS1 and CS2 may be the same as or similar to the memory cell stack CS described with reference to FIG. 2A. Except for the above features, the semiconductor device may have the same or similar structure as that in the embodiment described with reference to FIG. 19.

Figure 21:
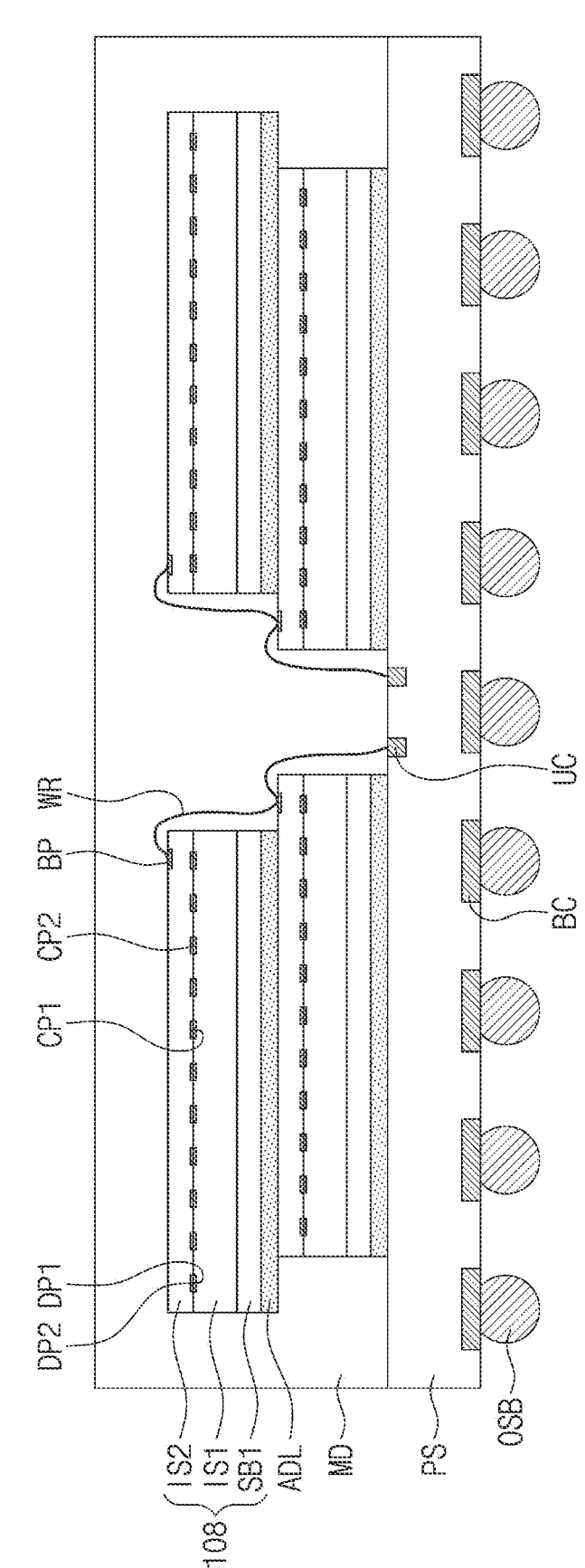
FIG. 21 is a sectional view illustrating a semiconductor package according to some embodiments of the inventive concept.

FIG. 21 is a sectional view illustrating a semiconductor package according to r of the inventive concept.

Referring to FIG. 21, a semiconductor package 1001 according to the present embodiments may include a package substrate PS and semiconductor devices 108 stacked on the package substrate PS. In some embodiments, the package substrate PS may be a two- or multi-layer printed circuit board. The printed circuit board may include an insulating body portion and photo-solder resist (PSR) layers on or covering top and bottom surfaces of the body portion. In some embodiments, the package substrate PS may be a redistribution substrate. The redistribution substrate may include a plurality of photo-imageable dielectric (PID) layers and redistribution patterns therebetween. The redistribution patterns may be formed of or include at least one of metallic materials (e.g., copper). Each of the redistribution patterns may include line portions and via portions connected thereto.

The package substrate PS may include upper metal pads UC and lower metal pads BC. Inner interconnection lines, which connect the upper metal pads UC to the lower metal pads BC, may be in the package substrate PS. Outer connection members OSB may be bonded to the lower metal pads BC. The outer connection members OSB may be conductive bumps and/or solder balls.

The semiconductor devices 108 may have substantially the same structure as that in the embodiment of FIG. 18. One of the semiconductor devices described with reference to FIGS. 1 to 20 may be provided in place of the semiconductor devices 108. The semiconductor devices 108 may be attached to the package substrate PS by an adhesive layer ADL. Wires WR may connect the bonding pads BP of the semiconductor devices 108 to the upper metal pads UC of the package substrate PS. The package substrate PS may be on or covered with a mold layer MD.

According to some embodiments of the inventive concept, a semiconductor device may include dummy pads. This may make it possible to reduce an un-bonding issue between sub-chips. In this case, it may be possible to prevent a failure from occurring in an electric connection structure between the sub-chips and thereby to increase a yield, and thus, a semiconductor device with improved reliability may be provided.

In addition, dummy pads in a scribe lane region (or an edge region) may be used as a diffusion path of hydrogen ions (H⁺). In this case, it may be possible to improve electrical and operation characteristics of a memory cell stack.

A semiconductor device according to some embodiments of the inventive concept may include a guard ring structure, which is provided near the outermost sidewall thereof and is used to prevent a lateral propagation of a crack in a sawing process. Accordingly, it may be possible to reduce a failure of a semiconductor device.

Furthermore, a semiconductor device according to some embodiments of the inventive concept may include a scattering beam blocking pattern, which is used to prevent a bonding failure, and it may be possible to realize a semiconductor device with improved reliability.

While example embodiments of the inventive concept have been particularly shown and described, it will be understood by one of ordinary skill in the art that variations in form and detail may be made therein without departing from the scope of the attached claims. The embodiments of FIGS. 1 to 21 may be variously combined to realize the inventive concept.

What is claimed is:

1. A semiconductor device, comprising:
a first substrate including a device region and an edge region;
a first insulating structure on the first substrate;
first metal pads and first dummy pads on an uppermost end of the first insulating structure;
a second insulating structure on the first insulating structure;
second metal pads and second dummy pads on a lowermost end of the second insulating structure;
a first interconnection structure in the first insulating structure and electrically connected to the first metal pads, the first interconnection structure being electrically isolated from the first dummy pads;
a second interconnection structure in the second insulating structure and electrically connected to the second metal pads, the second interconnection structure being electrically isolated from the second dummy pads,
a second substrate on the second insulating structure;
second transistors under the second substrate, wherein the second insulating structure is on the second transistors; and
a penetration electrode that extends into the second substrate and is connected to the second interconnection structure;

wherein ones of the first metal pads are in contact with respective ones of the second metal pads on the device region, and
ones of the first dummy pads are in contact with respective ones of the second dummy pads on the edge region.

2. The semiconductor device of claim 1, further comprising:
a test pattern on the edge region and on the second insulating structure; and a protection layer on the second insulating structure and at least partially exposing the test pattern.

3. The semiconductor device of claim 1, further comprising a memory cell stack on the device region of the first substrate and having the first insulating structure thereon,
wherein the memory cell stack comprises:
electrode layers and inter-electrode insulating layers, which are alternately stacked on the first substrate; and
vertical semiconductor patterns extending into the inter-electrode insulating layers and the electrode layers and are adjacent to the first substrate, and
one of the first metal pads is connected to a respective one of the electrode layers.

4. The semiconductor device of claim 1, further comprising a second guard ring structure on the edge region and in the second insulating structure,
wherein the second guard ring structure extends into the second insulating structure, and
the second guard ring structure is on an outer perimeter of the device region in a plan view.

5. The semiconductor device of claim 4, further comprising a first guard ring structure on the edge region and in the first insulating structure,
wherein the first guard ring structure extends into the first insulating structure, and
the first guard ring structure is on an outer perimeter of the device region in a plan view.

6. The semiconductor device of claim 4, wherein a side surface of the second guard ring structure is at least partially exposed, and
a side surface of the first insulating structure extends laterally from a side surface of the second guard ring structure.

7. The semiconductor device of claim 4, wherein a distance from an outer side surface of the second insulating structure to the second guard ring structure ranges from 0-15 µm.

8. The semiconductor device of claim 1, wherein a side surface of the second insulating structure extends laterally from a side surface of the first insulating structure.

9. The semiconductor device of claim 1, further comprising a metal plate on the edge region and in the first insulating structure that overlaps at least one of the first dummy pads in a direction perpendicular to an upper surface of the first substrate,
wherein the metal plate is electrically isolated from the first and second dummy pads.

10. A semiconductor device, comprising:
a first substrate including a device region and an edge region;
a first insulating structure on the first substrate;
first metal pads at an uppermost end of the first insulating structure;
a second insulating structure on the first insulating structure;
second metal pads at a lowermost end of the second insulating structure;

a first interconnection structure in the first insulating structure and electrically connected to the first metal pads;

a second interconnection structure in the second insulating structure and electrically connected to the second metal pads; and a second guard ring structure extending into the second insulating structure on the edge region, wherein ones of the first metal pads are in contact with respective ones of the second metal pads on the device region, and a distance from an outer side surface of the second insulating structure to the second guard ring structure ranges from 0 to 15 μm.

11. The semiconductor device of claim 10, further comprising:

first dummy pads at the uppermost end of the first insulating structure and spaced apart from the first metal pads; and second dummy pads at the lowermost end of the second insulating structure and spaced apart from the second metal pads, wherein ones of the first dummy pads are in contact with respective ones of the second dummy pads on the edge region.

12. The semiconductor device of claim 10, further comprising: a second substrate on the second insulating structure;

second transistors under the second substrate and having the second insulating structure thereon; and a penetration electrode extending into the second substrate and connected to the second interconnection structure.

13. The semiconductor device of claim 10, wherein a side surface of the second insulating structure extends laterally from a side surface of the first insulating structure.

14. The semiconductor device of claim 10, wherein a side surface of the second guard ring structure is at least partially exposed, and a side surface of the first insulating structure extends laterally from a side surface of the second guard ring structure.

15. A semiconductor device, comprising:

a first substrate including a device region and an edge region; a first insulating structure on the first substrate;

first metal pads and first dummy pads at an uppermost end of the first insulating structure;

a second insulating structure on the first insulating structure;

second metal pads and second dummy pads at a lowermost end of the second insulating structure;

a first interconnection structure in the first insulating structure, electrically connected to the first metal pads, and electrically isolated from the first dummy pads;

a second interconnection structure in the second insulating structure, electrically connected to the second metal pads, and electrically isolated from the second dummy pads;

a second guard ring structure on the edge region extending into the second insulating structure; and a scattering beam blocking pattern on the edge region and in the first insulating structure and overlapping at least one of the first dummy pads, wherein ones of the first metal pads are on the device region and in contact with respective ones of the second metal pads, and ones of the first dummy pads are on the edge region and in contact with respective ones of the second dummy pads.

16. The semiconductor device of claim 15, further comprising:

a second substrate on the second insulating structure;

second transistors below the second substrate and having the second insulating structure thereon; and a penetration electrode extending into the second substrate and connected to the second interconnection structure.

17. The semiconductor device of claim 15, further comprising a memory cell stack on the device region of the first substrate wherein the first insulating structure is on the memory cell stack, wherein the memory cell stack comprises:

electrode layers and inter-electrode insulating layers alternately stacked on the first substrate; and vertical semiconductor patterns extending into the inter-electrode insulating layers and the electrode layers and are adjacent to the first substrate, and one of the first metal pads is connected to a respective one of the electrode layers.

18. The semiconductor device of claim 15, wherein a side surface of the second guard ring structure is exposed, and a side surface of the first insulating structure extends laterally from a side surface of the second guard ring structure.

19. The semiconductor device of claim 15, wherein a side surface of the second insulating structure extends laterally from a side surface of the first insulating structure.

* * * * *